United States Patent
Qiu et al.

(10) Patent No.: US 11,450,777 B1
(45) Date of Patent: Sep. 20, 2022

(54) BACK CONTACT STRUCTURE AND SELECTIVE CONTACT REGION BURIED SOLAR CELL COMPRISING THE SAME

(71) Applicant: Solarlab Aiko Europe GmbH, Freiburg (DE)

(72) Inventors: Kaifu Qiu, Yiwu (CN); Yongqian Wang, Yiwu (CN); Xinqiang Yang, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 17/540,275

(22) Filed: Dec. 2, 2021

Related U.S. Application Data

(63) Continuation of application No. 17/383,470, filed on Jul. 23, 2021, now abandoned.

(30) Foreign Application Priority Data

Jun. 4, 2021 (CN) .......................... 202110627508.4

(51) Int. Cl.
*H01L 31/0224* (2006.01)
*H01L 31/0236* (2006.01)
(Continued)

(52) U.S. Cl.
CPC .... *H01L 31/022441* (2013.01); *H01L 31/028* (2013.01); *H01L 31/02363* (2013.01); *H01L 31/022466* (2013.01); *H01L 31/0682* (2013.01)

(58) Field of Classification Search
CPC ....... H01L 31/022441; H01L 31/02363; H01L 31/0682
See application file for complete search history.

(56) References Cited

U.S. PATENT DOCUMENTS 7,812,250 B2  10/2010  Smith
2011/0000532 A1*  1/2011  Niira .................. H01L 31/0747
257/E31.13
(Continued)

FOREIGN PATENT DOCUMENTS

WO    2018016548 A1    1/2018

OTHER PUBLICATIONS

Armin Richter et al., n-Type Si solar cells with passivating electron contact: Identifying sources for efficiency limitations by wafer thickness and resistivity variation, Solar Energy Materials and Solar Cells, Dec. 2017, pp. 96-105, vol. 173, Elsevier, Amsterdam, Netherlands.
(Continued)

*Primary Examiner* — Angelo Trivisonno
(74) *Attorney, Agent, or Firm* — Matthias Scholl P.C.; Matthias Scholl

(57) ABSTRACT

A back contact structure includes: a silicon substrate including a back including a plurality of recesses disposed at intervals; a first dielectric layer disposed on the back surface of the silicon substrate, the first dielectric layer at least covering the plurality of recesses; a plurality of P-type doped regions and N-type doped regions disposed on the first dielectric layer and disposed alternately in the plurality of recesses; a second dielectric layer disposed between the plurality of P-type doped regions and the plurality of N-type doped regions; and a conductive layer disposed on the plurality of P-type doped regions and the plurality of N-type doped regions

24 Claims, 12 Drawing Sheets

(51) Int. Cl.
*H01L 31/068* (2012.01)
*H01L 31/028* (2006.01)

(56) References Cited

U.S. PATENT DOCUMENTS

2017/0200850 A1* 7/2017 Lee .................. H01L 31/02167
2019/0245111 A1* 8/2019 Yoon .................. H01L 31/0682

OTHER PUBLICATIONS

Christian Reichel et al., Interdigitated Back Contact Silicon Solar Cells Featuring Ion-Implanted Poly-Si/Siox Passivating Contacts, Presented at the 33rd European PV Solar Energy Conference and Exhibition, Sep. 2017, pp. 25-29, Amsterdam, Netherlands.

Andrea Ingenito et al., A passivating contact for silicon solar cells formed during a single firing thermal annealing, Nature Energy, Sep. 2018, pp. 800-808, vol. 3, Nature Research, London, United Kingdom.

Felix Haase et al., Laser contact openings for local poly-Si-metal contacts enabling 26.1%-efficient POLO-IBC solar cells, Solar Energy Materials and Solar Cells, Nov. 2018, pp. 184-193, vol. 186, Elsevier, Amsterdam, Netherlands.

Byungsul Min et al., A 22.3% Efficient p-Type Back Junction Solar Cell with an Al-Printed Front-Side Grid and a Passivating n+-Type Polysilicon on Oxide Contact at the Rear Side, Solar RRL, Dec. 2020, pp. 1-4 of 200435, vol. 4 No. 12, Wiley-VCH GmbH, Weinheim, Germany.

Puqun Wang et al., Development of TOPCon tunnel-IBC solar cells with screen-printed fire-through contacts by laser patterning, Solar Energy Materials and Solar Cells, Jan. 2021, pp. 1-8 of 110834, vol. 220, Elsevier, Amsterdam, Netherlands.

* cited by examiner

BACK CONTACT STRUCTURE AND SELECTIVE CONTACT REGION BURIED SOLAR CELL COMPRISING THE SAME

CROSS-REFERENCE TO RELATED APPLICATIONS

This application is a continuation of U.S. application Ser. No. 17/383,470, filed Jul. 23, 2021, now pending, and further claims foreign priority benefits to Chinese Patent Application No. 202110627508.4, filed Jun. 4, 2021. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, Mass. 02142.

BACKGROUND

The disclosure relates to the field of solar cells, and more particularly to a back contact structure and a selective contact region buried solar cell comprising the same.

In a crystalline silicon solar cell, efficiency losses of the cell may be divided into two aspects, i.e., electric losses and optical losses. Important parts of the electric losses are composite losses and resistance losses caused by metal-semiconductor contacts, while an important part of the optical losses is a shading of metal grid lines of illuminated faces.

A passivated metal contact structure has remarkable electrical performance, and can obtain a low contact resistivity and low surface composition at the same time; this structure comprises an ultrathin tunneling oxide layer and an N-type doped or P-type doped polycrystalline silicon layer. Since the absorption of light by the doped polycrystalline silicon layer belongs to "parasitic" absorption, i.e., no contribution to a photo-generated current, the passivated metal contact structure is chiefly applied to a back of the cell, so that a front surface thoroughly avoids the shielding of the metal grid lines. Solar radiation received on the solar cell generates electrons and holes; these electrons and holes are migrated to the doped polycrystalline silicon layer, to generate a voltage difference in the doped polycrystalline silicon layer.

The existing P-type doped polycrystalline silicon layer and the N-type doped polycrystalline silicon layer are directly deposited on a back of a silicon slice; however, when they are connected to each other without separation, undesirable phenomena such as electric leakage would occur. Hence, to solve the problem of no separation above, by forming an ultra-condensed trench between the P-type doped polycrystalline silicon layer and the N-type doped polycrystalline silicon layer, the P-type doped polycrystalline silicon layer is separated from the N-type doped polycrystalline silicon layer, to prevent a cell open-circuit voltage reduction from electric leakage. However, the existing trench is prepared through laser perforation or wet etching; in this case, since the width of the existing trench is dozens of microns, and thus width control is highly required, so that the preparation is difficult. Besides, the passivation is performed using only a single dielectric layer; however, using the single dielectric layer for passivation has a relatively poor passivation effect and a poor inner back reflection effect.

SUMMARY

An objective of an embodiment of the disclosure is to provide a back contact structure of a solar cell, aiming at solving the existing problems of a high trench width control requirement and a poor passivation effect.

The disclosure provides a back contact structure of a solar cell, the back contact structure comprising:
- a silicon substrate, the silicon substrate comprising a back surface comprising a plurality of recesses disposed at intervals;
- a first dielectric layer disposed on the back surface of the silicon substrate, the first dielectric layer at least covering the plurality of recesses;
- a plurality of P-type doped regions and a plurality of N-type doped regions disposed on the first dielectric layer and disposed alternately in the plurality of recesses;
- a second dielectric layer disposed between the plurality of P-type doped regions and the plurality of N-type doped regions, wherein the second dielectric layer is at least one in number; and
- a conductive layer disposed on the plurality of P-type doped regions and the plurality of N-type doped regions.

In a class of this embodiment, the plurality of P-type doped regions and the plurality of N-type doped regions comprise doped polycrystalline silicon, doped silicon carbide or doped amorphous silicon.

In a class of this embodiment, the first dielectric layer is one of a tunneling oxide layer, an intrinsic silicon carbide layer and an intrinsic amorphous silicon layer, or a combination thereof.

In a class of this embodiment, the second dielectric layer is one of an aluminum oxide layer, a silicon nitride layer, a silicon oxynitride layer, an intrinsic silicon carbide layer, an intrinsic amorphous silicon layer and a silicon oxide layer, or a combination thereof.

In a class of this embodiment, the second dielectric layer covers regions between the recesses of the silicon substrate, or extends to cover the P-type doped regions and/or the N-type doped regions.

In a class of this embodiment, a part of the back surface of the silicon substrate between the plurality of recesses comprises a rough texture structure.

In a class of this embodiment, a plurality of first doped layers is disposed on part or all of the silicon substrate located on regions between the recesses.

In a class of this embodiment, the width of the plurality of recesses receiving the plurality of P-type doped regions is set to 300-600 μm, the width of the plurality of recesses receiving the plurality of N-type doped regions is set to 100-500 μm, the depth of each of the recesses is 0.01-10 μm, and the between every two adjacent recesses is 20-500 μm.

In a class of this embodiment, the first dielectric layer covers the recesses, or covers an entire back surface of the silicon substrate.

In a class of this embodiment, the first dielectric layer is connected to bottom walls and sidewalls of the recesses.

In a class of this embodiment, the first dielectric layer is connected to bottom walls of the recesses and the second dielectric layer is further connected to sidewalls of the recesses.

In a class of this embodiment, the plurality of recesses is in the shape of an arc, a trapezoid, or a square.

In a class of this embodiment, the thickness of the first dielectric layer is 1-20 nm, the total thickness of the first dielectric layer and the plurality of P-type doped regions is greater than 20 nm, and the total thickness of the first dielectric layer and the plurality of N-type doped regions is greater than 20 nm.

In a class of this embodiment, the total thickness of the first dielectric layer and the plurality of P-type doped regions and/or the total thickness of the first dielectric layer and the plurality of N-type doped regions disposed in the plurality of recesses is less than or equal to the depth of the recess.

In a class of this embodiment, the total thickness of the first dielectric layer and the plurality of P-type doped regions and/or the total thickness of the first dielectric layer and the plurality of N-type doped regions disposed in the plurality of recesses is greater than the depth of the recess.

In a class of this embodiment, the doped silicon carbide comprises doped hydrogenated silicon carbide.

In a class of this embodiment, the first dielectric layer comprises the tunneling oxide layer and the intrinsic silicon carbide layer.

In a class of this embodiment, the tunneling oxide layer comprises one or more of a silicon oxide layer and an aluminum oxide layer.

In a class of this embodiment, the intrinsic silicon carbide layer in the first dielectric layer comprises an intrinsic hydrogenated silicon carbide layer.

In a class of this embodiment, the second dielectric layer comprises the aluminum oxide layer and the intrinsic silicon carbide layer or the silicon oxide layer and the intrinsic silicon carbide layer, and the thickness of the second dielectric layer is greater than 25 nm.

In a class of this embodiment, the thickness of the aluminum oxide layer or the silicon oxide layer in the second dielectric layer is less than 25 nm, and the thickness of the intrinsic silicon carbide layer in the second dielectric layer is greater than 10 nm.

In a class of this embodiment, the intrinsic silicon carbide layer in the second dielectric layer comprises at least one first intrinsic silicon carbide film.

In a class of this embodiment, the refractive indexes of the first intrinsic silicon carbide films successively decrease outward from the back surface of the silicon substrate.

In a class of this embodiment, a magnesium fluoride layer is disposed at an outer layer of the second dielectric layer.

In a class of this embodiment, the conductive layer is a transparent conductive oxide (TCO) film and/or a metal electrode.

In a class of this embodiment, the metal electrode comprises a silver electrode, a copper electrode, an aluminum electrode, a tin-clad copper electrode, or a silver-clad copper electrode.

In a class of this embodiment, the copper electrode is electro-plated copper prepared through an electroplating process or a copper electrode prepared through physical vapor deposition.

In a class of this embodiment, a first dielectric layer corresponding to the P-type doped regions is the same as or different from a first dielectric layer corresponding to the N-type doped regions.

In a class of this embodiment, the P-type doped regions and/or the N-type doped regions extend onto the regions between the recesses.

The objective of another embodiment of the disclosure is to further provide a selective contact region buried solar cell, comprising:
the aforesaid back contact structure; and
a third dielectric layer disposed on a front surface of the silicon substrate.

In a class of this embodiment, the third dielectric layer is one of an aluminum oxide layer, a silicon nitride layer, a silicon oxynitride layer, a silicon carbide layer, an intrinsic amorphous silicon layer and a silicon oxide layer, or a combination thereof.

In a class of this embodiment, the third dielectric layer comprises the silicon oxide layer and the silicon carbide layer or the aluminum oxide layer and the silicon carbide layer, and the thickness of the third dielectric layer is greater than 50 nm.

In a class of this embodiment, the thickness of the aluminum oxide layer or the silicon oxide layer in the third dielectric layer is less than 40 nm, and the thickness of the silicon carbide layer in the third dielectric layer is greater than 10 nm.

In a class of this embodiment, the silicon carbide layer in the third dielectric layer comprises at least one second intrinsic silicon carbide film.

In a class of this embodiment, the refractive indexes of different silicon carbide films decrease from the front surface of the silicon substrate to outside.

In a class of this embodiment, a magnesium fluoride layer is disposed at an outer layer of the third dielectric layer.

In a class of this embodiment, an electric field layer or a floating junction is disposed between the front surface of the silicon substrate and the third dielectric layer.

The objective of another embodiment of the disclosure is to further provide a cell assembly, comprising the selective contact region buried solar cell as stated above.

The objective of another embodiment of the disclosure is to further provide a photovoltaic system, comprising the cell assembly as stated above.

The objective of another embodiment of the disclosure is to further provide a selective contact region buried solar cell manufacturing method, comprising:
forming a plurality of recesses disposed at intervals on a back of a silicon substrate;
preparing a first dielectric layer on the back surface of the silicon substrate, the first dielectric layer at least covering the recesses;
preparing P-type doped regions and N-type doped regions inside the recesses;
respectively preparing a second dielectric layer and a third dielectric layer on the back and front surface of the silicon substrate; and
preparing a conductive layer on the P-type doped regions and the N-type doped regions.

In a class of this embodiment, the step of preparing, inside the recesses, P-type doped regions and N-type doped regions disposed alternately comprises:
depositing intrinsic amorphous silicon or intrinsic silicon carbide inside the recesses; and
alternately performing different doping types of doping inside the recesses; and
performing high temperature crystallization treatment, so that the intrinsic amorphous silicon or intrinsic silicon carbide is changed into doped polycrystalline silicon or doped silicon carbide to obtain the P-type doped regions and the N-type doped regions disposed alternately.

In a class of this embodiment, the step of preparing, inside the recesses, P-type doped regions and N-type doped regions disposed alternately comprises:
depositing intrinsic amorphous silicon or intrinsic silicon carbide inside the recesses; and
alternately performing different types of diffusions inside the recesses through a mask, so that the intrinsic amorphous silicon or intrinsic silicon carbide is changed into doped polycrystalline silicon or doped silicon carbide to obtain the P-type doped regions and the N-type doped regions disposed alternately.

In a class of this embodiment, the step of preparing, inside the recesses, P-type doped regions and N-type doped regions disposed alternately comprises:

alternately depositing doped amorphous silicon or doped amorphous silicon carbide in different doping types inside the recesses; and performing high temperature crystallization treatment, so that the doped amorphous silicon or doped amorphous silicon carbide is changed into doped polycrystalline silicon or doped silicon carbide to obtain the P-type doped regions and the N-type doped regions disposed alternately.

In a class of this embodiment, the step of alternately performing different doping types of doping inside the recesses comprises:

alternately injecting P-type ions or N-type ions for doping inside the recesses; or alternately depositing P-type doping sources and N-type doping sources inside the recesses; or alternately introducing P-type source gas or N-type source gas for doping inside the recesses.

In the back contact structure of the solar cell provided in the embodiment of the disclosure, recesses are disposed at intervals on a back of a silicon substrate, and P-type doped regions and N-type doped regions are disposed alternately inside the recesses, so that separation between the P-type doped regions and the N-type doped regions inside the recesses is implemented through a protrusion structure between the recesses of the silicon substrate itself; moreover, the recesses disposed have a lower width control requirement than existing trenches, so the preparation of the recesses is easier than preparation of the existing trenches. Further, when a first dielectric layer, P-type doped regions and N-type doped regions are deposited in the recesses, the deposition effect is better. In addition, since the arrangement of the recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding P-type doped regions and N-type doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed has at least one layer, multi-layer induced passivation is achieved on the back surface of the silicon substrate through the second dielectric layer having at least one layer, and inner back reflection is enhanced, thereby solving the existing problems of a high trench width control requirement and a poor passivation effect and a poor inner back reflection.

DETAILED DESCRIPTION

Figure 1:
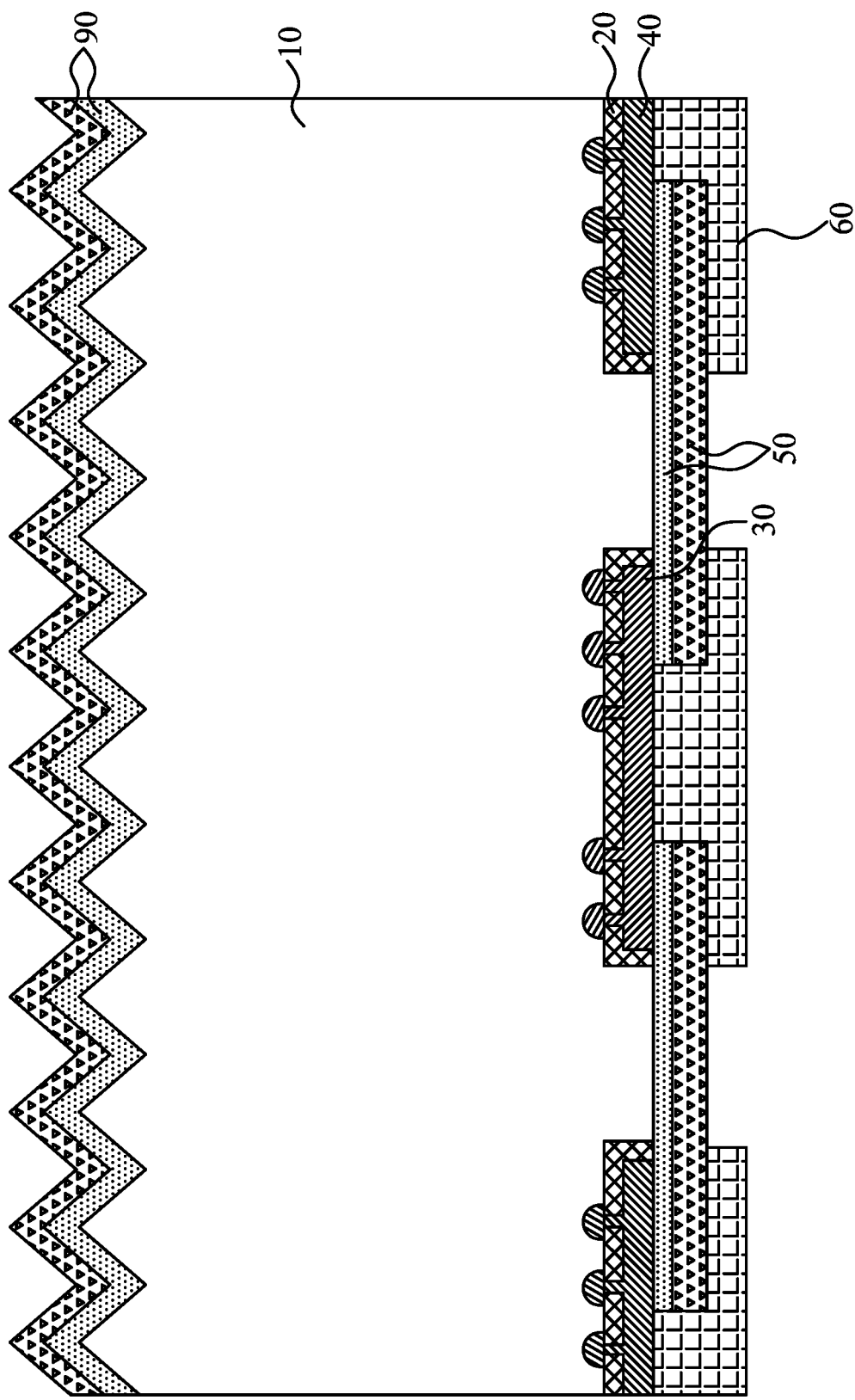
FIG. 1 to FIG. 11 are structural schematic diagrams of various implementations of a selective contact region buried solar cell provided by one embodiment of the disclosure.

To make the objective, technical solutions, and advantages of the disclosure clearer, the following further describes the disclosure in detail in conjunction with the accompanying drawings and embodiments. It should be understood that the specific embodiments described herein are merely used for explaining the disclosure but are not intended to limit the disclosure.

In the disclosure, unless otherwise specified and defined, the terms such as "mount", "connected with", "connected to" and "fix" should be comprehended in a broad sense. For example, these terms may be comprehended as being fixedly connected, detachably connected or integrally connected; or mechanically connected, or electrically connected; or directly connected, or indirectly connected through an intermediate medium, or in an internal communication between two elements. The specific meanings about the foregoing terms in the disclosure may be understood by those skilled in the art according to specific circumstances. The term "and/or" used in the text comprises any or all combinations of one or more related listed items.

In the disclosure, recesses are disposed at intervals on a back of a silicon substrate, and P-type doped regions and N-type doped regions are disposed alternately inside the recesses, so that separation between the P-type doped regions and the N-type doped regions inside the recesses is implemented through a protrusion structure of the silicon substrate itself between the recesses; moreover, the recesses disposed have a higher tolerance in width control requirement than existing trenches, and preparation of the recesses is easier than preparation of the existing trenches. Further, when a first dielectric layer, P-type doped regions and N-type doped regions are deposited in the recesses, the deposition effect is better because of the higher tolerance in width control. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding P-type doped regions and N-type doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed has at least one layer, multi-layer induced passivation is achieved at the back surface of the silicon substrate through the second dielectric layer having at least one layer, and inner back reflection is enhanced, thereby yielding a better passivation effect and a better inner back reflection effect and solving the existing problems of a high trench width control requirement and a poor passivation effect.

Embodiment 1

The first embodiment of the disclosure provides a back contact structure of a solar cell. To facilitate explanation, merely the parts related to the embodiment of the disclosure are illustrated. With reference to FIG. 1 to FIG. 11, the back contact structure of the solar cell provided by the embodiment of the disclosure comprises:

a plurality of recesses disposed at intervals on a back of a silicon substrate 10;

a first dielectric layer 20 disposed on the back surface of the silicon substrate 10, the first dielectric layer 20 at least covering the recesses;

a plurality of P-type doped regions 30 and N-type doped regions 40 disposed on the first dielectric layer 20 and disposed alternately in the recesses;

a second dielectric layer 50 disposed between the P-type doped regions 30 and the N-type doped regions 40, where the second dielectric layer 50 has at least one layer and the refractive index successively decreases outward from the back surface of the silicon substrate 10; and a conductive layer 60 disposed on the P-type doped regions 30 and the N-type doped regions 40.

In one embodiment of the disclosure, the silicon substrate 10 has a front facing the sun and a back opposite to the front during a normal working period, and the front is an illuminated face; the back is disposed on the other side of the silicon substrate 10 with respect to the front, i.e., the front and the back are located on different sides, i.e., opposite sides, of the silicon substrate 10, where in this embodiment, the silicon substrate 10 is an N-type silicon slice, and it can be understood that, in other embodiments, the silicon substrate 10 may also be another silicon slice. The recesses are formed at intervals on the back surface of the silicon substrate 10; the recesses can be formed through laser ablation or through a combination of a mask (such as a hard mask, a silicon oxide mask, a silicon nitride mask, and a photoresist mask) and wet/dry etching; in this case, due to the recesses formed at intervals on the back surface of the silicon substrate 10, a region between two adjacent recesses located on the silicon substrate 10 is roughly in a protrusion shape, and thus a back pattern of the silicon substrate 10 generally appears to be formed by staggering the recesses and protrusions.

Figure 2:
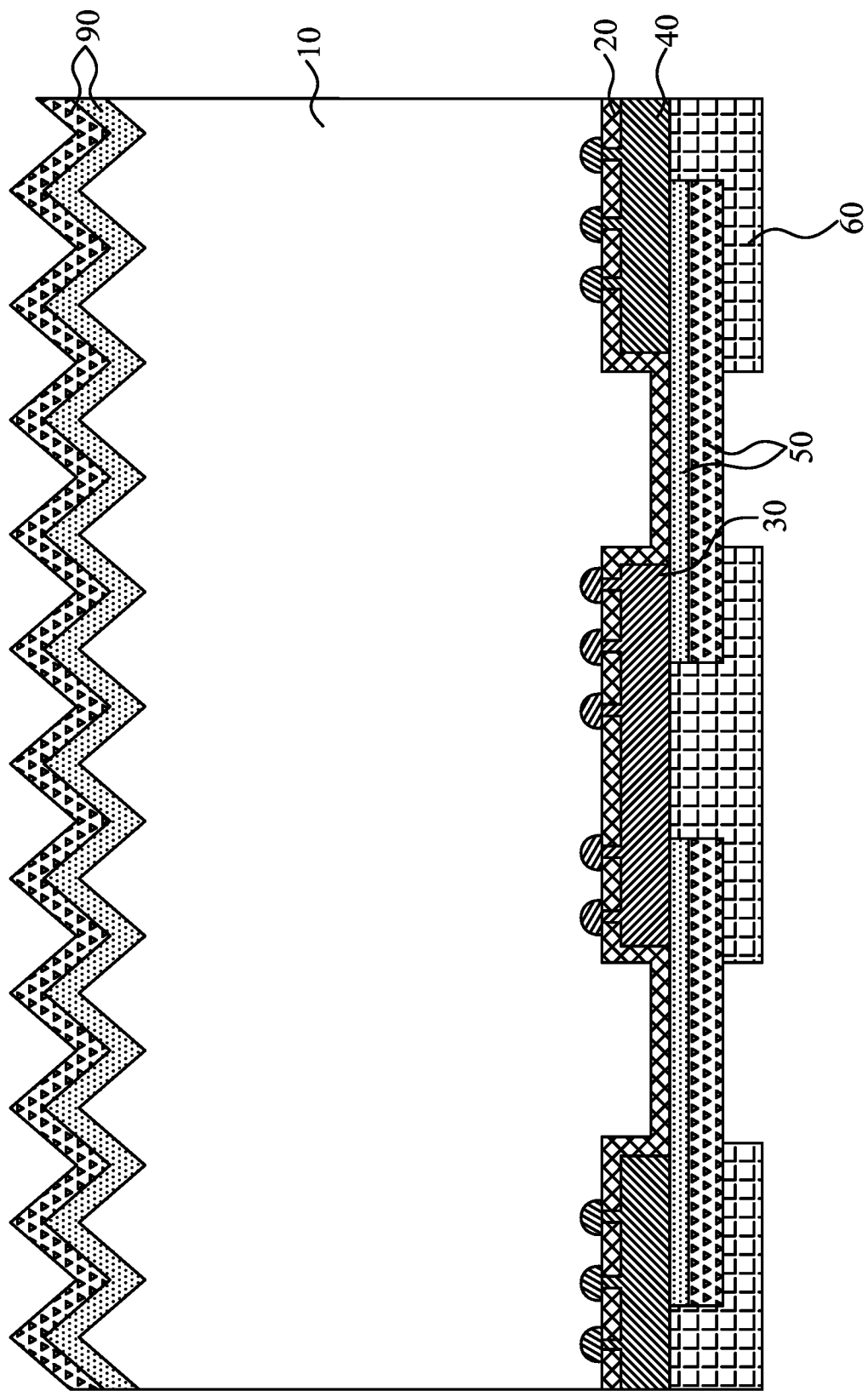

Furthermore, in one embodiment of the disclosure, the first dielectric layer 20 is located at the back surface of the silicon substrate 10 and at least covers each recess; during specific implementation, the first dielectric layer 20 covers each recess or covers the entire back surface of the silicon substrate 10. In an embodiment of the disclosure, as shown in FIG. 1, the first dielectric layer 20 only covers the recesses. In another embodiment of the disclosure, as shown in FIG. 2, the first dielectric layer 20 covers the entire back surface of the silicon substrate 10, i.e., the first dielectric layer 20 thereof covers the recesses and protrusions of the silicon substrate 10. It should be indicated that, as shown in FIG. 1 and FIG. 2, the first dielectric layer 20 covering the recesses specifically refers to covering the bottom walls and sidewalls of the recesses, and at this time, the first dielectric layer 20 is connected to the bottom walls and sidewalls of the recesses.

Furthermore, in one embodiment of the disclosure, if the first dielectric layer 20 and the P-type doped regions 30 are disposed inside a recess, the first dielectric layer 20 and the N-type doped regions 40 are disposed inside the another adjacent recess, so that the first dielectric layer 20 and the P-type doped regions 30 as well as the first dielectric layer 20 and the N-type doped regions 40 are disposed alternately in the recesses, where the first dielectric layer 20 is located between the silicon substrate 10 and the P-type doped regions 30 or the N-type doped regions 40 disposed in the recesses, and is used as a tunneling structure; moreover, the first dielectric layer 20 and the highly doped P-type doped regions 30 or N-type doped regions 40 connected thereto and covered thereby together form a passivated contact structure. The passivated contact structure provides good surface passivation for the back surface of the silicon substrate 10; in addition, generally speaking, the first dielectric layer 20 has a thin enough thickness, in which one type of the carriers achieves selective transmission through a tunneling principle, while another type of the carriers is hard to tunnel through the first dielectric layer 20 due to the existence of a barrier and a doped region field effect.

Therefore, the first dielectric layer 20 may allow one type of the carriers to tunnel through and enter the doped regions while blocking another type of the carriers from passing through to cause composition, so that interface composition can be obviously reduced, the solar cell has relatively high open-circuit voltage and short-circuit current, and then photovoltaic conversion efficiency is improved. Meanwhile, as shown in FIG. 1 to FIG. 11, a plurality of inner diffusion regions corresponding to the P-type doped regions 30 or N-type doped regions 40 are formed on the surface of the silicon substrate 10 in contact with the first dielectric layer 20; for example, a plurality of P+ inner diffusion regions are formed on the surface of the silicon substrate 10 in contact with the recesses provided with the first dielectric layer 20 and the P-type doped regions 30; for example, a plurality of N+ inner diffusion regions are formed on the surface of the silicon substrate 10 in contact with the recesses provided with the first dielectric layer 20 and the N-type doped regions 40. Meanwhile, in this embodiment, since the arrangement of the recesses enables the first dielectric layer 20 to be in contact with both bottom walls and sidewalls of the recesses, the carriers generated on the silicon substrate 10 would also be easily separated through the first dielectric layer 20 on the sidewalls of the recesses and selectively collected into the corresponding P-type doped regions 30 or N-type doped regions 40, thereby facilitating multi-dimensional collection of the carriers on the bottom walls and sidewalls of the recesses.

Furthermore, in one embodiment of the disclosure, the first dielectric layer 20 is preferably one of a tunneling oxide layer, an intrinsic silicon carbide layer and an intrinsic amorphous silicon layer, or a combination thereof. As some examples of the disclosure, for example, the first dielectric layer 20 may be a tunneling oxide layer of a single material, may also be a combination of a tunneling oxide layer and the intrinsic amorphous silicon layer of multiple materials, and may further be a combination of multiple layers of intrinsic amorphous silicon having different refractive indexes of a single material. It can be understood that the specific structural arrangement of the first dielectric layer 20 comprises, but not limited to, the several modes listed above, and according to actual usage needs, the first dielectric layer 20 is correspondingly configured, which is not specifically limited herein.

In a preferable embodiment of the disclosure, specifically, the first dielectric layer 20 is preferably the tunneling oxide layer and the intrinsic silicon carbide layer; in this case, the tunneling oxide layer and the intrinsic silicon carbide layer are successively arranged outward from the silicon substrate 10, the tunneling oxide layer is in contact with the back surface of the silicon substrate 10 inside the recesses, and the intrinsic silicon carbide layer is in contact with the P-type doped regions 30 or the N-type doped regions 40. Furthermore, the tunneling oxide layer preferably comprises one or more of a silicon oxide layer and an aluminum oxide layer. Hence, the first dielectric layer 20 may also be a combination of the silicon oxide layer and the aluminum oxide layer in the tunneling oxide layer. The intrinsic silicon carbide layer in the first dielectric layer 20 comprises an intrinsic hydrogenated silicon carbide layer. In this case, the tunneling oxide layer and the intrinsic silicon carbide layer reduce the density of interface states between the silicon substrate 10 and the N-type doped regions 40 as well as the P-type doped regions 30 through chemical passivation. For example, hydrogen in the intrinsic hydrogenated silicon carbide layer enters the silicon substrate 10 under the function of a diffusion mechanism and a thermal effect, to neutralize dangling bonds of the back surface of the silicon substrate 10, to passivate defects of the back surface of the silicon substrate 10, and to transfer an energy band in a forbidden band to a valence band or a conduction band to improve probability for the carriers to enter the P-type doped regions 30 or the N-type doped regions 40 through the first dielectric layer 20.

Generally speaking, as some specific examples of the disclosure, during specific usage, the first dielectric layer 20 preferably adopts the silicon oxide layer of 1-2 nm and the intrinsic silicon carbide layer of 2-5 nm; as compared with only using the silicon oxide layer as the tunneling structure, the intrinsic silicon carbide layer may further provide an additional hydrogen passivation effect; a preparing process window of the tunneling structure is enlarged, without influencing the tunneling effect; certainly, the silicon oxide layer of 1-2 nm, or the silicon oxide layer of 1 nm and the aluminum oxide layer of 1 nm, or two or more of the intrinsic silicon carbide layers having different refractive indexes can also be directly adopted; as can be understood, the specific structure arrangement of the first dielectric layer 20 comprises, but not limited to, the several specific examples listed above. In addition, the first dielectric layer 20 may also be an intrinsic microcrystalline silicon layer, an intrinsic microcrystalline silicon oxide layer, an intrinsic amorphous silicon oxide layer, etc. As shown in FIG. 1 to FIG. 11, it is only shown that the first dielectric layer 20 is a one-layer structure; as can be understood, the specific structure of the first dielectric layer 20 is set according to actual needs and does not completely follow the accompanying drawings of the description.

It should be indicated that when the first dielectric layer 20 only covers the recesses, the structure of the first dielectric layer 20 disposed on the recesses can be selected to be same or different, which specifically is: the first dielectric layer 20 corresponding to the P-type doped regions 30 is the same as or different from the first dielectric layer 20 corresponding to the N-type doped regions 40; for example, all of the first dielectric layers 20 may be selected as the silicon oxide layer and the intrinsic silicon carbide layer; the first dielectric layer 20 in the recesses provided with the P-type doped regions can also be the silicon oxide layer and the intrinsic silicon carbide layer, and the first dielectric layer 20 in the recesses provided with the N-type doped regions comprises the aluminum oxide layer and the intrinsic silicon carbide layer. According to actual usage needs, a film layer structure of the first dielectric layer 20 on each recess is correspondingly set, which is not specifically limited herein.

Furthermore, in one embodiment of the disclosure, the P-type doped regions 30 and the N-type doped regions 40 are respectively disposed inside the recesses; the P-type doped regions 30 and the N-type doped regions 40 preferably comprise the doped polycrystalline silicon or doped silicon carbide or doped amorphous silicon, where the doped silicon carbide may comprise doped hydrogenated silicon carbide, and the doped hydrogenated silicon carbide is specifically formed by adding hydrogen when depositing the silicon carbide. It should be indicated that when the first dielectric layer 20 comprises the silicon oxide layer and the intrinsic silicon carbide layer above, the plurality of P-type doped regions 30 and the plurality of N-type doped regions 40 are specifically doped silicon carbide. Moreover, when the first dielectric layer 20 comprises the silicon oxide layer or other combinations, the P-type doped regions 30 and the N-type doped regions 40 may be doped polycrystalline silicon or the like. When the first dielectric layer 20 is the intrinsic amorphous silicon layer, at this time, the P-type doped regions 30 and the N-type doped regions 40 are specifically doped amorphous silicon. Meanwhile, it should be indicated that the P-type doped regions 30 and the N-type doped regions 40 may be selected to be the same or different, for example, the P-type doped regions 30 and the N-type doped regions 40 are all doped polycrystalline silicon; or the P-type doped regions 30 are doped polycrystalline silicon, and the N-type doped regions 40 are doped silicon carbide, or the like; according to actual usage needs, the P-type doped regions 30 and the N-type doped regions 40 are correspondingly set, which is not specifically limited herein.

Figure 3:
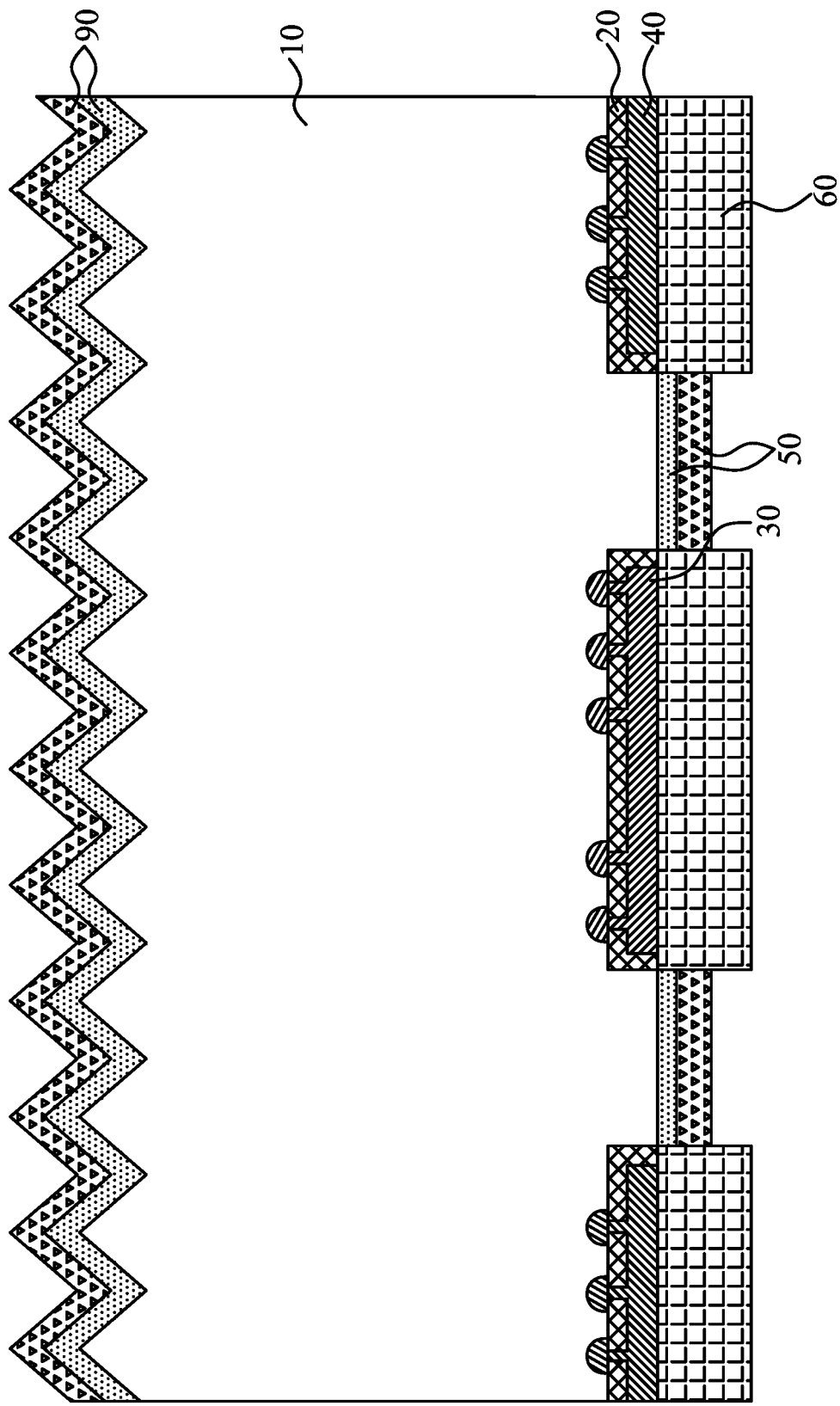

Furthermore, in an embodiment of the disclosure, the second dielectric layer 50 covers regions between the recesses of the silicon substrate 10, or extends to cover the P-type doped regions 30 and/or the N-type doped regions 40. That is to say, the second dielectric layer 50 may only cover the protrusions of the silicon substrate 10, as shown in FIG. 3; correspondingly, in this case, the conductive layer 60 covers the entire back of the P-type doped regions 30 and the N-type doped regions 40 for electrical connection. The second dielectric layer 50 may also extend from the protrusions to cover the P-type doped regions 30 and/or the N-type doped regions 40, see FIG. 1 for details; correspondingly, the second dielectric layer 50 may extend from the protrusions to cover part of regions of the P-type doped regions 30, or extend from the protrusions to cover part of regions of the N-type doped regions 40, or extend from the protrusions to cover part of the regions of the P-type doped regions 30 and the N-type doped regions 40, and in this case, the conductive layer 60 covers the remaining part of the back that does not cover the second dielectric layer 50 in the P-type doped regions 30 and the N-type doped regions 40 to form electrical connections to the P-type doped regions 30 and the N-type doped regions 40, respectively. Certainly, during the preparing process of the second dielectric layer 50, the entire back of the back contact structure can also be completely covered, and in this case, when preparing the conductive layer 60, the conductive layer 60 penetrates through the second dielectric layer 50 by means of perforation or the like to form electric connections to the P-type doped regions 30 and the N-type doped regions 40, respectively.

It should be indicated that when the first dielectric layer 20 merely covers the recesses, the second dielectric layer 50 at least covers the protrusion of the silicon substrate 10; at this time, the second dielectric layer 50 is in direct contact with the back of the protrusion of the silicon substrate 10 at the protrusions, as shown in FIG. 1. Moreover, when the first dielectric layer 20 covers the entire back surface of the silicon substrate 10, the second dielectric layer 50 at least covers the first dielectric layer 20 at the protrusion of the silicon substrate 10, and at this time, the second dielectric layer 50 is in contact with the first dielectric layer 20, as shown in FIG. 2. Certainly, in the above two ways, the second dielectric layer 50 can extend to cover the P-type doped regions 30 and/or the N-type doped regions 40.

Furthermore, in one embodiment of the disclosure, the second dielectric layer 50 is preferably selected from one of an aluminum oxide layer, a silicon nitride layer, a silicon oxynitride layer, an intrinsic silicon carbide layer, an intrinsic amorphous silicon layer and a silicon oxide layer, or a combination thereof. The second dielectric layer 50 plays a passivation function and the second dielectric layer 50 is at least set as a one-layer structure; the refractive index of each layer is set to successively decrease outward from the silicon substrate 10, so that the film layer adjacent to the silicon substrate 10 plays a passivation function, while the film layer away from the silicon substrate 10 plays an anti-reflection function, to enhance the anti-reflection effect, thereby increasing the absorption and usage of light by the silicon substrate 10, to increase the short-circuit current density. In addition, the second dielectric layer 50 may further be a doped silicon layer (such as a doped microcrystalline silicon layer, a doped amorphous silicon layer, and a doped polycrystalline silicon layer), a doped silicon carbide layer (such as a doped polycrystalline silicon carbide layer), a doped silicon oxide layer (such as a doped polycrystalline silicon oxide and doped amorphous silicon oxide), etc. In addition, each film layer of a different structure in the second dielectric layer 50 may comprise a plurality of films with different refractive indexes, and according to the fact that the refractive index of each film layer is set to successively decrease outward from the silicon substrate 10, for example, the silicon oxide layer in the second dielectric layer 50 may comprise a plurality of silicon oxide film layers having the refractive index successively decreasing outward from the silicon substrate 10.

As stated above, as some specific examples of the disclosure, for example, the second dielectric layer 50 may be a three-layer structure comprising the silicon oxide layer/aluminum oxide layer, intrinsic silicon carbide layer, and silicon nitride layer/silicon oxynitride layer; in this case, the thickness of the silicon oxide layer/aluminum oxide layer located at a first layer at an inner side is greater than 0.5 nm, the thickness of the intrinsic silicon carbide layer located at a second layer is greater than 1 nm, and the thickness of the silicon nitride layer/silicon oxynitride layer located at a third layer at an outer side is greater than 50 nm.

As some specific examples of the disclosure, for example, the second dielectric layer 50 may further be a two-layer structure comprising the aluminum oxide layer, and silicon nitride layer/silicon oxynitride layer; in this case, the thickness of the aluminum oxide layer located at a first layer at an inner side is greater than 1 nm, and the thickness of the silicon nitride layer/silicon oxynitride layer located at a second layer at an outer side is greater than 50 nm.

As some specific examples of the disclosure, for example, the second dielectric layer 50 may further be a three-layer structure comprising the silicon oxide layer/aluminum oxide layer, doped polycrystalline silicon layer/doped polycrystalline silicon carbide layer/doped polycrystalline silicon oxide layer, and silicon nitride layer/silicon oxynitride layer; in this case, the thickness of the silicon oxide layer/aluminum oxide layer located at a first layer at an inner side is 0.5-3 nm, the thickness of the doped polycrystalline silicon layer/doped polycrystalline silicon carbide layer/doped polycrystalline silicon oxide layer located at a second layer is 20-100 nm, and the thickness of the silicon nitride layer/silicon oxynitride layer located at a third layer at an outer side is greater than 50 nm.

As some specific examples of the disclosure, for example, the second dielectric layer 50 may further be a three-layer structure comprising the intrinsic amorphous silicon layer, doped amorphous silicon layer/doped amorphous silicon oxide layer, and silicon nitride layer/silicon oxynitride layer; in this case, the thickness of the intrinsic amorphous silicon layer located at a first layer at an inner side is 2-10 nm, the thickness of the doped amorphous silicon layer/doped amorphous silicon oxide layer located at a second layer is 2-50 nm, and the thickness of the silicon nitride layer/silicon oxynitride layer located at a second layer at an outer side is greater than 50 nm.

As some specific examples of the disclosure, for example, the second dielectric layer 50 may further be a three-layer structure comprising the silicon oxide/aluminum oxide layer, intrinsic silicon carbide layer/doped amorphous silicon oxide layer, and silicon nitride layer/silicon oxynitride layer; in this case, the thickness of the silicon oxide/aluminum oxide layer located at a first layer at an inner side is 0.5-3 nm, the thickness of the intrinsic silicon carbide layer/doped amorphous silicon oxide layer located at a second layer is 10-50 nm, and the thickness of the silicon nitride layer/silicon oxynitride layer located at a second layer at an outer side is greater than 50 nm.

As can be understood, the specific structure arrangement of the second dielectric layer 50 comprises, but not limited to, several specific examples listed above. In a preferable embodiment of the invention, as shown in FIG. 1, the second dielectric layer 50 is preferably a two-layer structure of an aluminum oxide layer and an intrinsic silicon carbide layer or a two-layer structure of a silicon oxide layer and an intrinsic silicon carbide layer, and in this case, the overall thickness of the second dielectric layer 50 is greater than 25 nm, where it is normally 70-80 nm during normal production and preparation. In this case, the intrinsic silicon carbide layer not only provides a hydrogen passivation effect, but also reduces parasitic light absorption due to a large optical band gap and a small absorption coefficient with respect to the intrinsic amorphous silicon layer and the doped polycrystalline silicon layer or the like. Furthermore, the thickness of the aluminum oxide layer or the silicon oxide layer in the second dielectric layer 50 is less than 25 nm, and the thickness of the intrinsic silicon carbide layer in the second dielectric layer 50 is greater than 10 nm. It should be indicated that in the multi-layer structure indicated in the embodiment of the disclosure, the order thereof is to arrange outward from the silicon substrate. For example, when the second dielectric layer 50 above comprises the aluminum oxide layer and intrinsic silicon carbide layer, the aluminum oxide layer is close to the silicon substrate, while the intrinsic silicon carbide layer is close to the outer side. Meanwhile, it should be indicated that in the accompanying drawings of the description, as shown in FIG. 1 to FIG. 11, it is only shown that the second dielectric layer 50 is a two-layer structure; as can be understood, the second dielectric layer 50 may further have other layer number, and the specific structure thereof is set according to actual needs and is not completely as shown in the accompanying drawings of the description.

Furthermore, the intrinsic silicon carbide layer in the second dielectric layer 50 comprises at least one first intrinsic silicon carbide film. The refractive indexes of the first intrinsic silicon carbide films successively decrease outward from the back surface of the silicon substrate 10. Optionally, the refractive index of each material is generally selected as: the refractive index of monocrystalline silicon is 3.88; the refractive index of amorphous silicon is 3.5-4.2; the refractive index of polycrystalline silicon is 3.93; the refractive index of silicon carbide is 2-3.88; the refractive index of silicon nitride is 1.9-3.88; the refractive index of silicon oxynitride is 1.45-3.88; the refractive index of silicon oxide is 1.45; and the refractive index of aluminum oxide is 1.63. As can be understood, the refractive index of each material above may further be set as others according to actual usage needs, and is not specifically limited herein.

Furthermore, in one embodiment of the disclosure, a magnesium fluoride layer is disposed at an outer layer of the second dielectric layer 50, i.e., based on the one of an aluminum oxide layer, a silicon nitride layer, a silicon oxynitride layer, an intrinsic silicon carbide layer, an intrinsic amorphous silicon layer and a silicon oxide layer, or a combination thereof selected by the second dielectric layer 50, the magnesium fluoride layer can further be disposed at the outer layer of the second dielectric layer 50. The refractive index requirement for the magnesium fluoride layer is the lowest, and generally, the refractive index thereof is set as 1.4, for enhancing the optical function of anti-reflection.

Furthermore, in one embodiment of the disclosure, the conductive layer 60 is a TCO (transparent conductive oxide) film and/or a metal electrode. The metal electrode comprises a silver electrode, a copper electrode, an aluminum electrode, a tin-clad copper electrode, or a silver-clad copper electrode. Furthermore, the copper electrode is electroplated copper prepared through an electroplating process or a copper electrode prepared through physical vapor deposition. For the electro-plated copper, nickel, chromium, titanium, and tungsten electrodes serve as a seed layer or a protective layer. When the back contact structure is applied to HBC cells (Interdigitated Back Contact (IBC) heterojunction solar cells) manufactured in low-temperature processes, the conductive layer 60 is a TCO (transparent conductive oxide) film and a metal electrode, and when the back contact structure is applied to POLO-IBC cells (passivated contact IBC cells) manufactured in high-temperature processes, the conductive layer 60 is a metal electrode. However, it should be indicated that the metal electrode made of a low-temperature silver paste can only be applied to the HBC cells manufactured in low-temperature processes.

Figure 4:
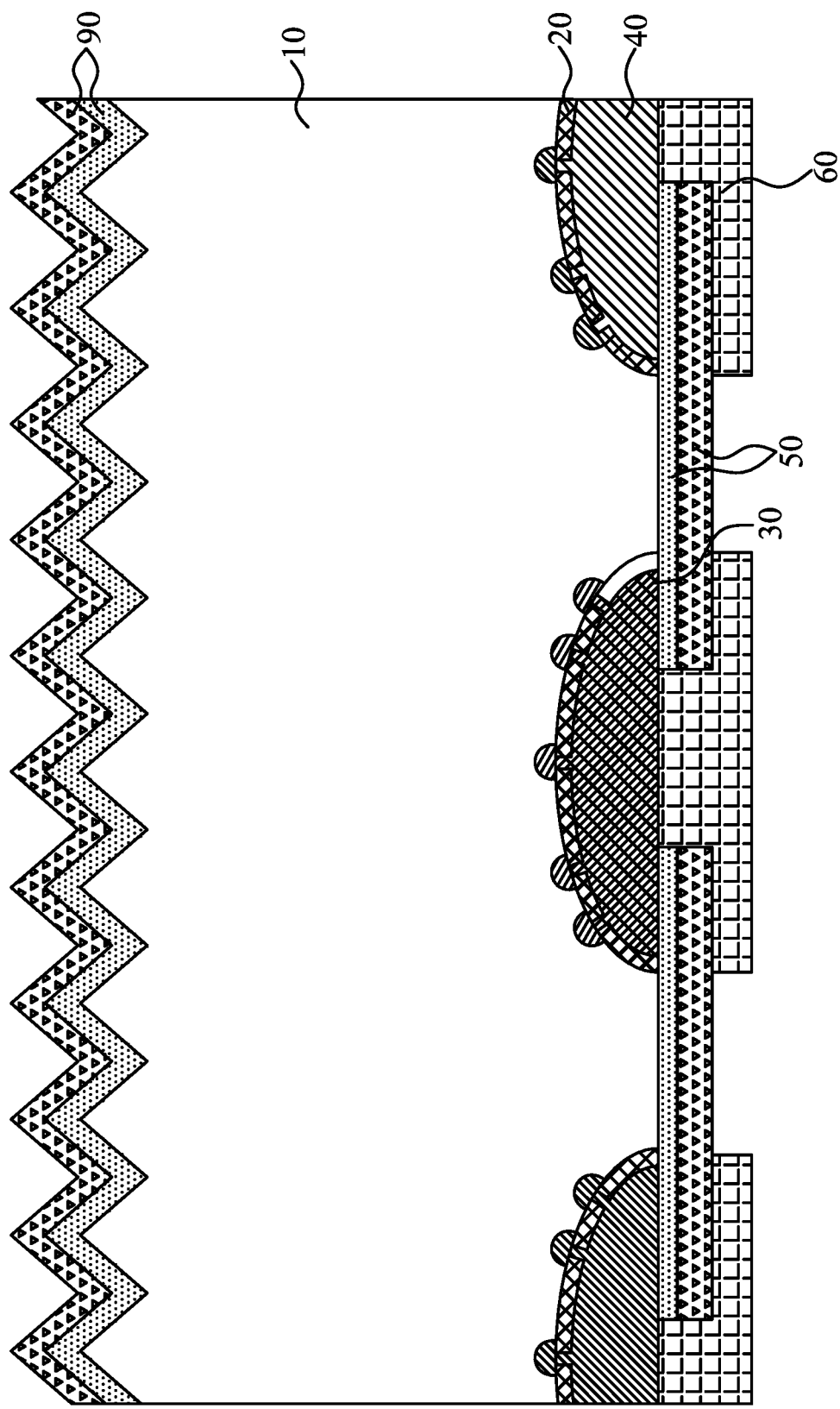
Figure 5:
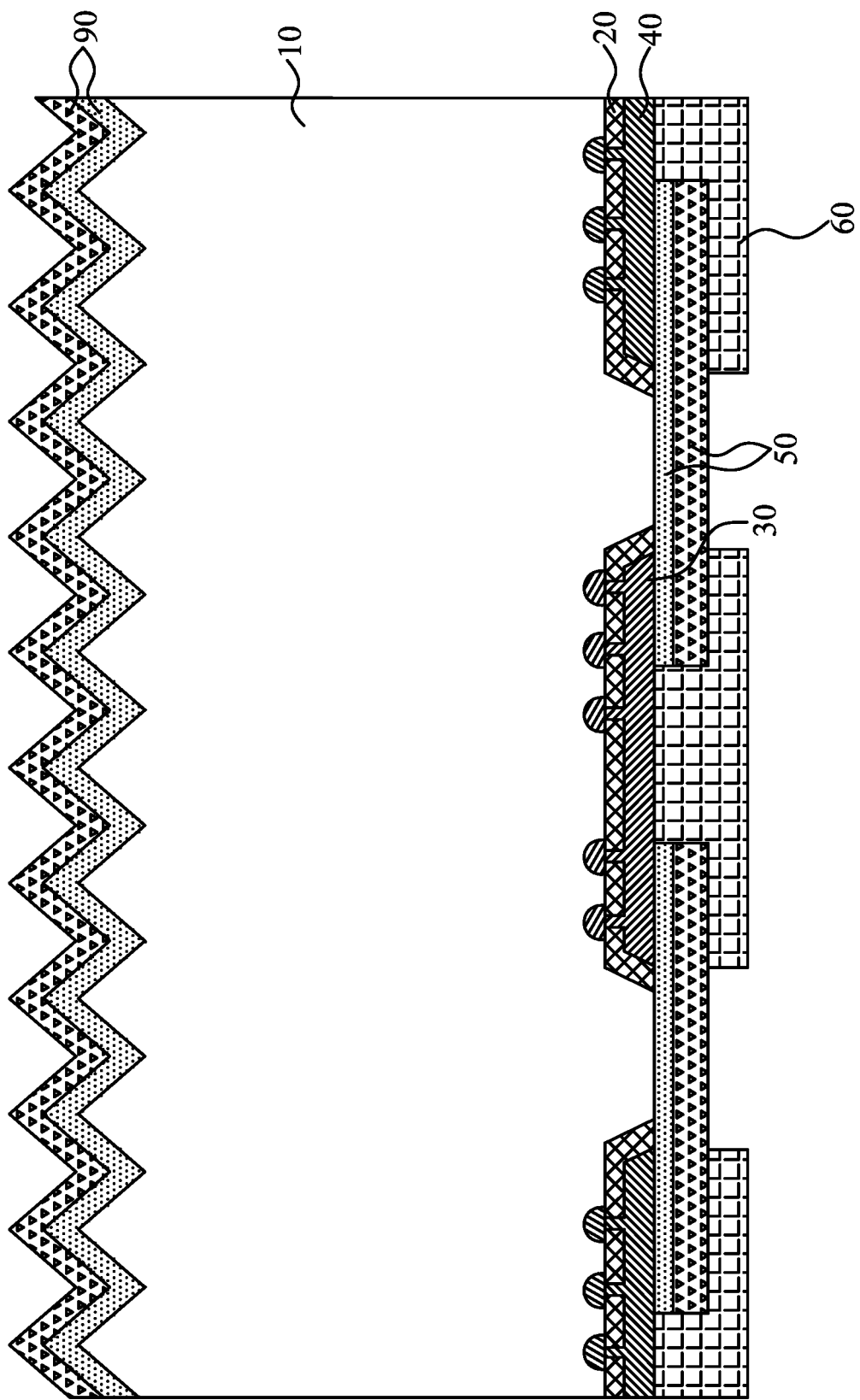

Furthermore, in one embodiment of the disclosure, the plurality of recesses is in the shape of an arc, a trapezoid, or a square. As shown in FIG. 1, in a specific embodiment, the plurality of recesses is a square. As shown in FIG. 4, in another specific embodiment, the recess is in the shape of an arc. As shown in FIG. 5, in another specific embodiment, the recess is a trapezoid. The recess is preferably to be set as an arc or a trapezoid, because when the recess is set as an arc or a trapezoid, an effect of reflecting light by the inner wall of the recess is better, and the surface area of the first dielectric layer 20 specifically as the tunneling structure in contact with the silicon substrate 10 can further be increased. Certainly, when the recess is set as a square, the actual production process thereof is simpler, and at the same time, it should be indicated that the shape of each recess maybe the same or different, for example, the recesses of the P-type doped regions 30 and the recesses of the N-type doped regions 40 are all set as square, or the recesses of the P-type doped regions 30 are set as square, and the recesses of the N-type doped regions 40 are set as arc, and the like, and therefore, the shape of each recess is set according to actual usage needs thereof, which is not specifically limited herein.

Figure 6:
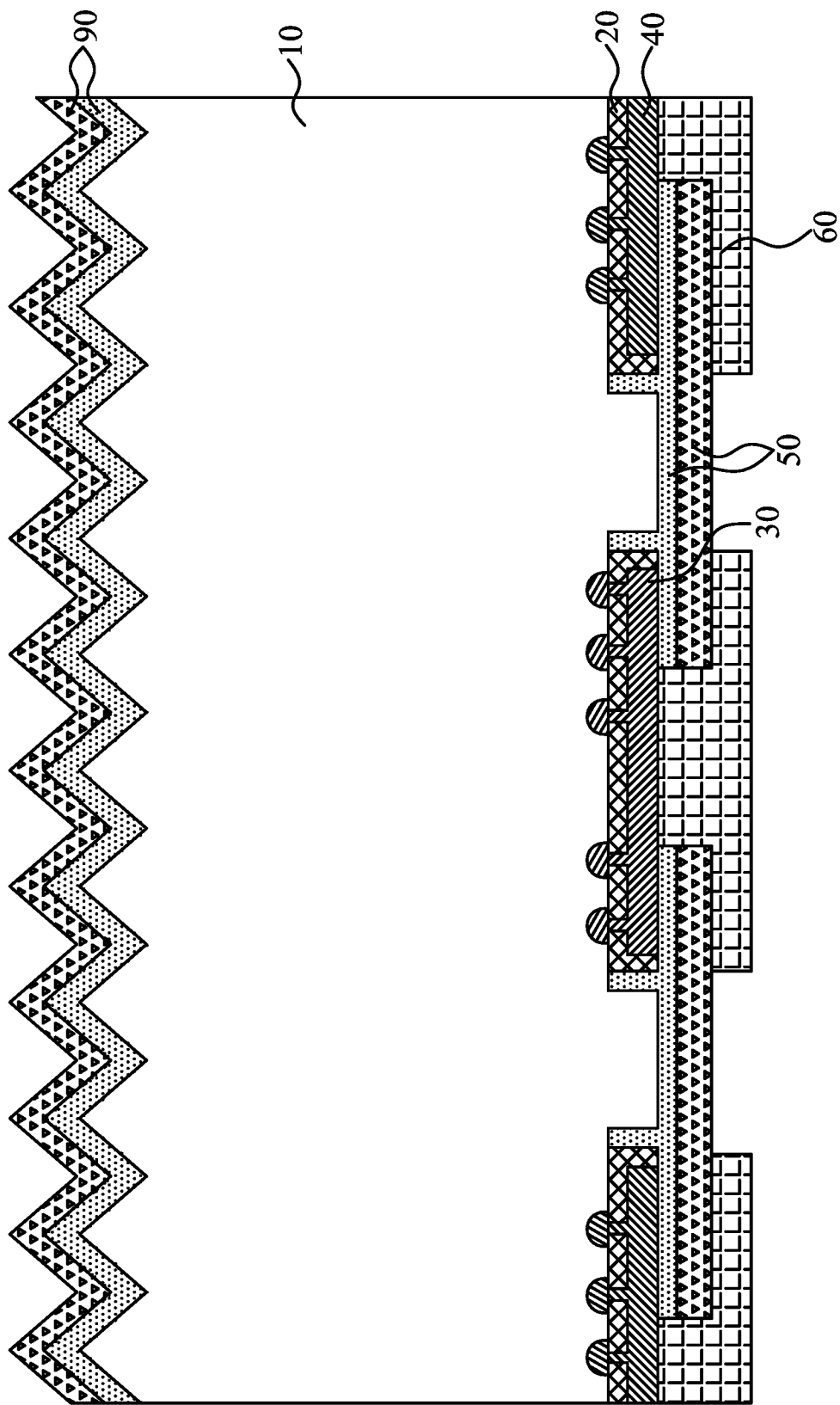
Figure 7:
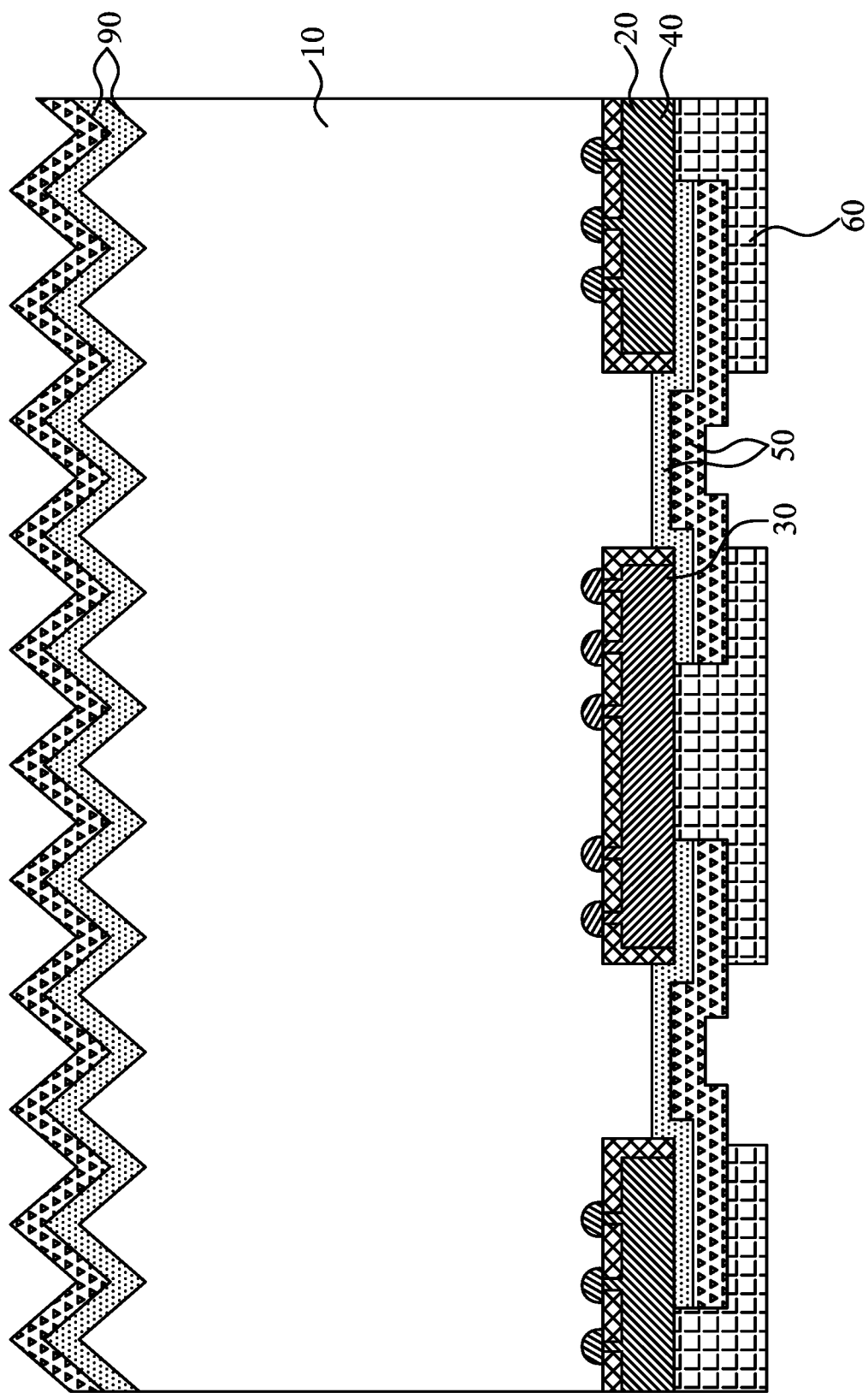
Figure 8:
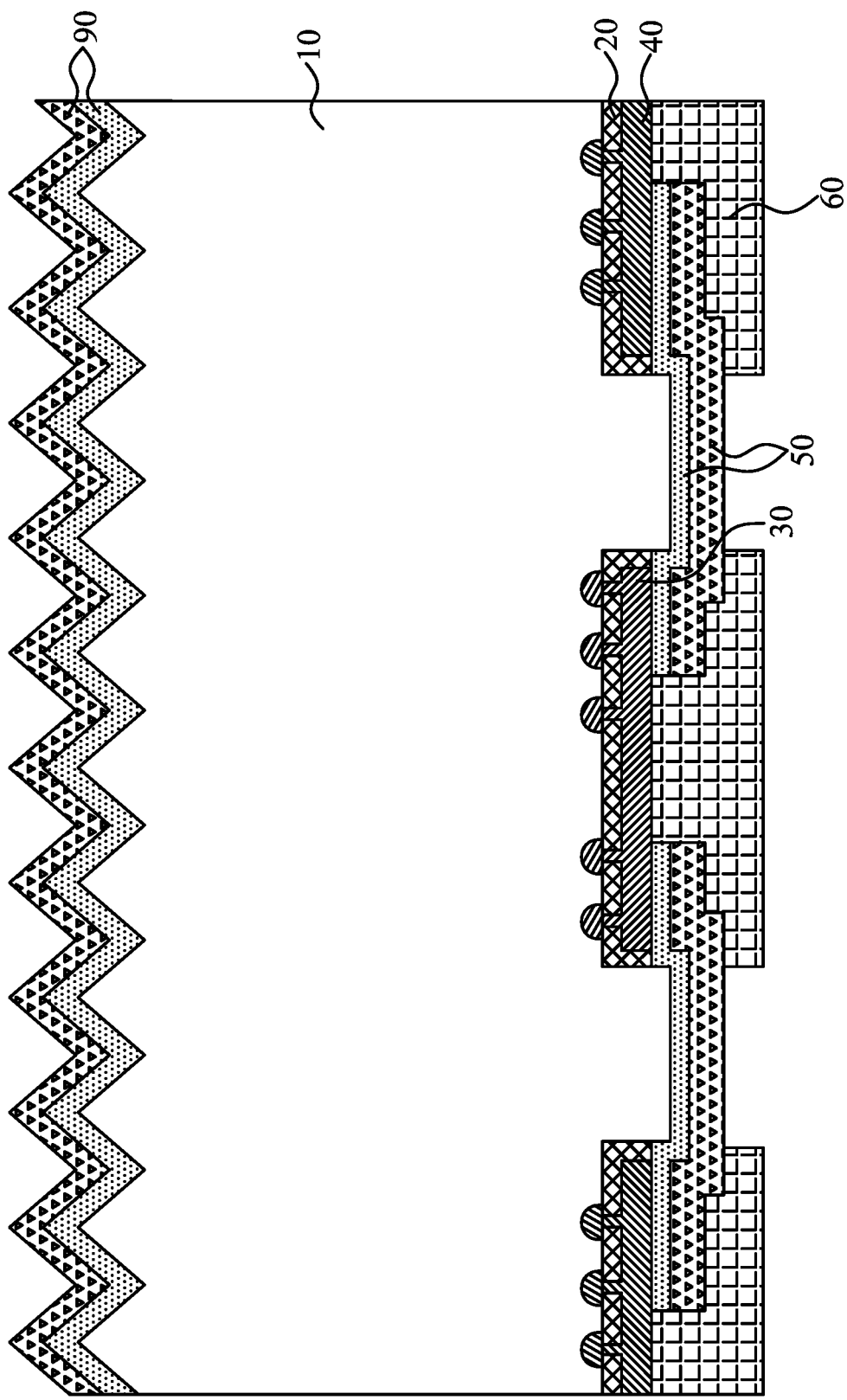

It should be indicated that, in other embodiments of the disclosure, it is possible that the first dielectric layer 20 is connected to the bottom walls of the recesses and the second dielectric layer 50 is further connected to the sidewalls of the recesses. As shown in FIG. 6, this is mainly because that the recess region is covered using the mask, and then when the mask is removed in a subsequent process, silicon in part of the silicon substrate 10 near the plurality of P-type doped regions 30 or plurality of N-type doped regions 40 will be corroded to widen the recess; and when the second dielectric layer 50 is deposited in a subsequent process, the second dielectric layer 50 will be deposited in a blank region, so that the second dielectric layer 50 is connected to the sidewall of the recess. Or, when an arc-shaped recess (such as an ellipsoid-shaped recess) is prepared, there may be a case where the first dielectric layer 20 and the plurality of P-type doped regions 30 or plurality of N-type doped regions 40 cannot be deposited onto the inner wall of the arc-shaped recess in the long-axis direction, and thus the blank region may be filled with the second dielectric layer 50 during deposition thereof so that the second dielectric layer 50 is connected to the sidewall of the arc-shaped recess, or there may be another case where the second dielectric layer 50 cannot be deposited to the blank region during deposition so that a certain gap is formed between the sidewall of the arc-shaped recess and the first dielectric layer 20 and the plurality of P-type doped regions 30 or plurality of N-type doped regions 40. Absolutely, it should be indicated that in the back contact structure of the embodiments of the disclosure, it is preferable that the first dielectric layer 20 is directly connected to the sidewall of the recess, so that the first dielectric layer 20 disposed on the sidewall of the recess can allow selective pass-through of the carriers to achieve multi-dimension collection.

Furthermore, in one embodiment of the disclosure, the thickness of the first dielectric layer 20 is 1-20 nm, the total thickness of the first dielectric layer 20 and the plurality of P-type doped regions 30 is greater than 20 nm, and the total thickness of the first dielectric layer 20 and the plurality of N-type doped regions 40 is greater than 20 nm. The width of the recess of the plurality of P-type doped regions 30 is 300-600 μm, the width of the recess of the plurality of N-type doped regions 40 is 100-500 μm, the depth of each of the recesses is 0.01-10 μm, and the between every two adjacent recesses is 20-500 μm. As a preferable embodiment of the disclosure, the width of the recess of the plurality of P-type doped regions 30 is preferably set to 500 μm, the width of the recess of the plurality of N-type doped regions 40 is preferably set to 300 μm, and the between every two adjacent recesses is preferably 100 μm. In view of the above, the width control requirement of dozens of microns for the set recess width is looser as compared with the existing trenches; it would be easier to prepare it as compared with preparing the existing trenches. It should be indicated that each of the accompanying drawings of the description is merely used for describing each specific structure distribution in the back contact structure thereof, but it does not correspond to the actual size dimension of each structure. For example, the thickness of the first dielectric layer 20 above is 1-20 nm, and the thickness of the second dielectric layer 50 is greater than 25 nm; in the accompanying drawings, they do not completely correspond to the specific actual size dimensions in this embodiment, and should depend on the specific parameters provided in this embodiment.

Furthermore, in an embodiment of the disclosure, the total thickness of the first dielectric layer 20 and the plurality of P-type doped regions 30 and/or the total thickness of the first dielectric layer 20 and the plurality of N-type doped regions 40 disposed in the recess is less than or equal to the depth of the recess. In addition, in another embodiment of the disclosure, the total thickness of the first dielectric layer 20 and the plurality of P-type doped regions 30 and/or the total thickness of the first dielectric layer 20 and the plurality of N-type doped regions 40 disposed in the recess is greater than the depth of the recess. In conjunction with the two possible embodiments, multiple combination modes may appear, such as the total thickness of the first dielectric layer 20 and the plurality of P-type doped regions 30 and the total thickness of the first dielectric layer 20 and the plurality of N-type doped regions 40 are both greater than the depth of the recess, both equal to the depth of the recess, and both less than the depth of the recess; or the total thickness of the first dielectric layer 20 and the plurality of P-type doped regions 30 is greater than the depth of the recess, while the total thickness of the first dielectric layer 20 and the plurality of N-type doped regions 40 is less than the depth of the recess; or the total thickness of the first dielectric layer 20 and the plurality of P-type doped regions 30 is less than the depth of the recess while the total thickness of the first dielectric layer 20 and the plurality of N-type doped regions 40 is greater than the depth of the recess. With reference to FIG. 1, the total thickness of the first dielectric layer 20 and the plurality of P-type doped regions 30 and the total thickness of the first dielectric layer 20 and the plurality of N-type doped regions 40 are both equal to the depth of the recess; at this time, the second dielectric layer 50 forms a plane shape while covering the protrusion, P-type doped regions 30, and N-type doped regions 40 of the silicon substrate 10, and separation between the P-type doped regions 30 and the N-type doped regions 40 is implemented through the protrusion of the silicon substrate 10. Moreover, with reference to FIG. 7, the total thickness of the first dielectric layer 20 and the plurality of P-type doped regions 30 and the total thickness of the first dielectric layer 20 and the plurality of N-type doped regions 40 are both greater than the depth of the recess; at this time, the second dielectric layer 50 forms a trench while covering the protrusion, P-type doped regions 30, and N-type doped regions 40 of the silicon substrate 10, and at this time, separation between the P-type doped regions 30 and the N-type doped regions 40 is implemented through the protrusion of the silicon substrate 10 and the trench formed by the second dielectric layer 50. Moreover, with reference to FIG. 8, the total thickness of the first dielectric layer 20 and the plurality of P-type doped regions 30 and the total thickness of the first dielectric layer 20 and the plurality of N-type doped regions 40 is less than the depth of the recess. At this time, separation between the P-type doped regions 30 and the N-type doped regions 40 is implemented through the protrusion of the silicon substrate 10.

Figure 9:
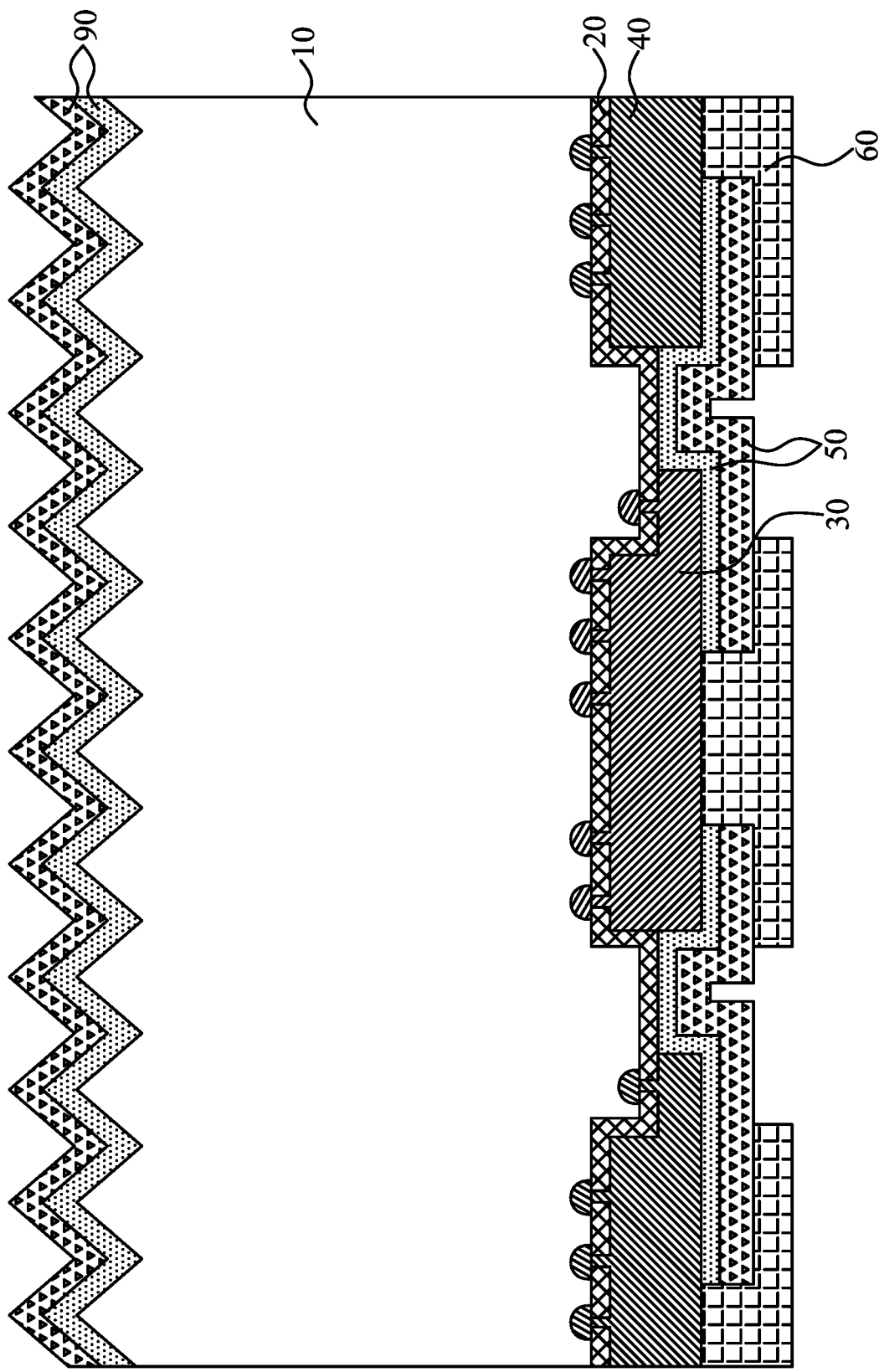

It should be indicated, in one embodiment of the disclosure, as shown in FIG. 9, when the first dielectric layer 20 covers the entire back surface of the silicon substrate 10 and the total thickness of the first dielectric layer 20 and the plurality of P-type doped regions 30 and/or the total thickness of the first dielectric layer 20 and the plurality of N-type doped regions 40 is greater than the depth of the recess; the P-type doped regions 30 and/or the N-type doped regions 40 can further extend to regions between the recesses, i.e., for example, the P-type doped regions 30 can extend to part or all of the regions between the recesses, and are not in contact with the adjacent N-type doped regions 40; in this case, a passivated contact structure is also formed on the first dielectric layer 20 and the P-type doped regions 30 disposed on the protrusion regions between the recesses; moreover, the first dielectric layer 20 and the P-type doped regions 30 in the recesses are communicated to increase a contact area of the first dielectric layer 20 through which the carriers selectively pass. It should be indicated that when the P-type doped regions 30 above extend to all of the regions between the recesses, the first dielectric layer 20 and the N-type doped regions 40 need to be less than the depth of the recess, so that the P-type doped regions 30 extending out from the recesses are not in contact with the adjacent N-type doped regions 40. FIG. 9 merely shows that the P-type doped regions 30 and the N-type doped regions 40 extend along a side of the protrusion; as can be understood, the P-type doped regions 30 and/or the N-type doped regions 40 can also extend along two sides of the protrusion; at this time, the P-type doped regions 30 and/or the N-type doped regions 40 extending on the protrusion are not connected to the adjacent N-type doped regions 40 and/or P-type doped regions 30.

Figure 10:
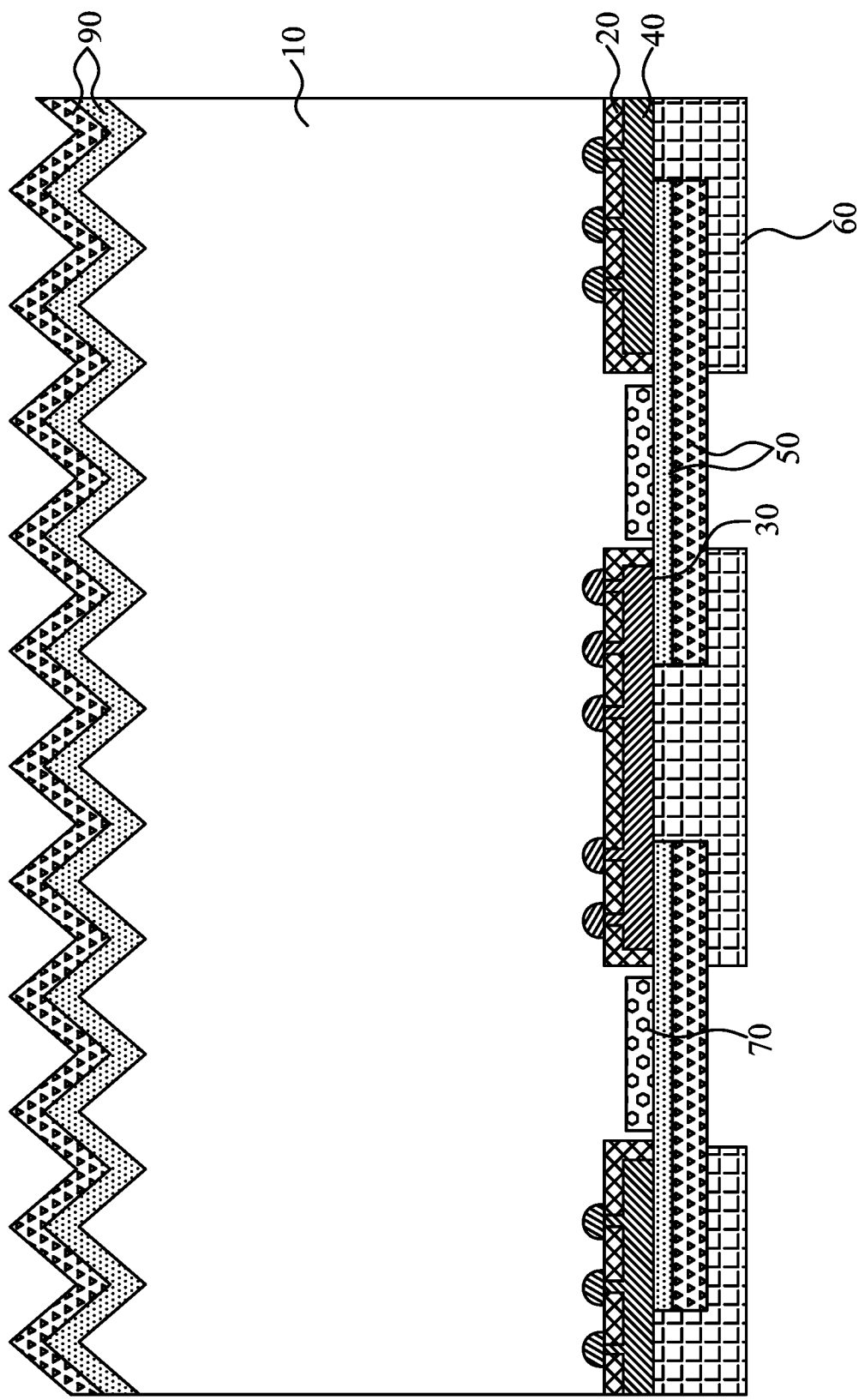

Furthermore, in one embodiment of the disclosure, as shown in FIG. 10, first doped layers 70 are disposed in part or all of the silicon substrate 10 located on regions between the recesses. That is to say, the first doped layers 70 are disposed on the protrusions of the silicon substrate 10, where the first doped layers 70 may be disposed on the protrusions taken as a whole and may also be disposed on part of the regions of the protrusions. The first doped layer 70 is specifically a diffusion layer. The diffusion layer is a diffusion layer formed by doping different types of diffusion sources on the silicon substrate 10 of the protrusions, and thus is a diffusion layer formed by partially diffusing the silicon substrate 10 of the protrusions. The diffusion layer may be a P-type diffusion layer or an N-type diffusion layer, where the P-type diffusion layer is formed by diffusion of doped boron, aluminum, gallium or the like, and the N-type diffusion layer is formed by diffusion of doped nitrogen, phosphorus, arsenic or the like. In this case, the N-type diffusion layer is an N+ layer with respect to the silicon substrate 10 which is specifically an N-type silicon slice, i.e., the diffusion layer is formed by local heavy diffusion. It should be indicated that the first doped layer 70 disposed on the protrusions of the silicon substrate 10 may be correspondingly set as the P-type diffusion layers or the N-type diffusion layers depending on actual usage needs, which is not specifically limited herein. Preferably, the P-type diffusion layers and the N-type diffusion layers are formed by alternately performing different types of diffusion on the protrusions of the silicon substrate 10. In this case, since the first dielectric layer 20 is disposed on the sidewalls of the recesses and the first doped layer 70 is formed by performing diffusion in regions between the recesses in the silicon substrate 10, it would be easier for the carriers in a first doped layer 70 to selectively pass through the first dielectric layer 20 on the sidewall of the adjacent recess to be separated and collected into the corresponding plurality of P-type doped regions 30 or plurality of N-type doped regions 40.

Figure 11:
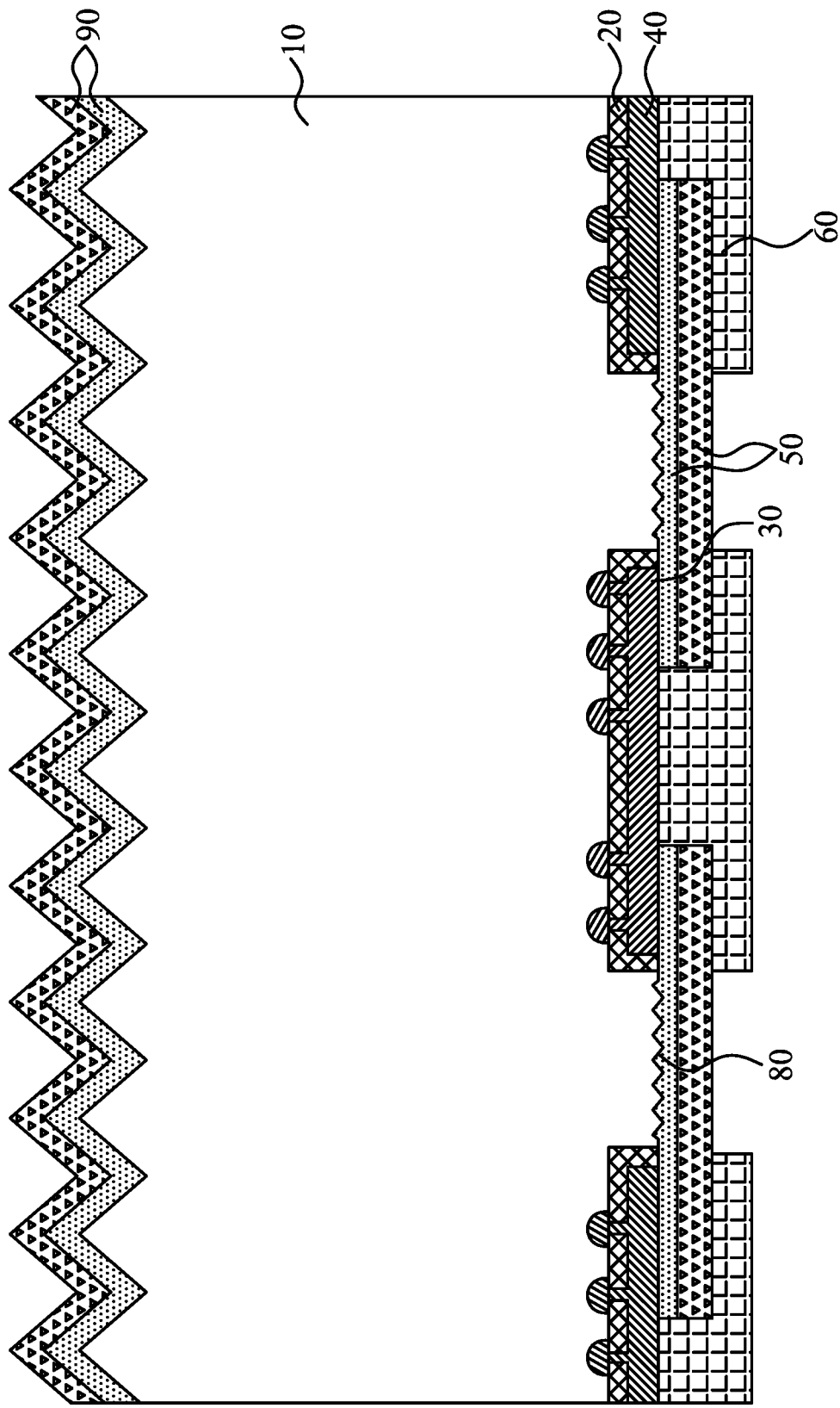

Furthermore, in one embodiment of the disclosure, as shown in FIG. 11, a back surface of the silicon substrate 10 located on regions between the recesses comprises a rough texture structure 80. That is to say, the protrusion surface of the silicon substrate 10 thereof has the rough texture structure 80, where when the first dielectric layer 20 merely covers the recesses, the rough texture structure 80 is located at a position where the second dielectric layer 50 is in contact with the back surface of the silicon substrate 10; when the first dielectric layer 20 covers the back of the entire silicon substrate 10, the rough texture structure 80 is located at a position where the first dielectric layer 20 is in contact with the back surface of the silicon substrate 10. The rough texture structure 80 is generally made through texturing, comprising forming hemispherical textures through acid texturing and forming pyramid-shaped textures through alkaline texturing, or forming pyramid-shaped textures through alkaline texturing and then performing rounding treatment on pyramid apexes through acid texturing. It should be understood that the rough texture structure 80 may also be disposed on the entire back surface of the silicon substrate 10, that is, the silicon substrate 10 inside the recesses also has the rough texture structure 80. In this case, the entire back surface of the silicon substrate 10 on which the recesses are formed is directly textured, without the subsequent process of removing the rough texture structure 80 inside the recesses, so that the process is simplified. However, it should be indicated that in this embodiment, it is preferable that texturing is only performed on the protrusion surface of the silicon substrate 10, to increase the reflection of the incident light inside the silicon substrate 10 to increase the absorption rate of light, while texturing is not performed on the inner surface of the recess. In this case, after the entire back surface of the silicon substrate 10 on which the recesses are formed is directly textured, the rough texture structure 80 in the recesses are removed through laser.

By tests, with respect to the POLO-IBC cell prepared in an existing trench manner in the control group, the cell conversion efficiency of the HBC cell and the POLO-IBC cell prepared from the back contact structure provided in the embodiments of the disclosure can be effectively improved to about 26.1% and the reliability is greatly improved. Electrical performance results are shown in Table 1 below:

TABLE 1

| Name | UOC | JSC | FF | EF |
|---|---|---|---|---|
| HBC | 745 | 41.5 | 84.5% | 26.1% |
| POLO-IBC | 730 | 42.0 | 84.8% | 26.0% |
| Control group | 725 | 41.6 | 84.5% | 25.5% |

The embodiment of the disclosure has the following beneficial effects with respect to the prior art:

1. The recesses are disposed at intervals on the back surface of the silicon substrate; moreover, P-type doped regions and N-type doped regions are disposed alternately inside the recesses, so that separation between the P-type doped regions and the N-type doped regions inside the recesses is implemented through a protrusion structure between the recesses of the silicon substrate itself; moreover, the recesses disposed have a lower width control requirement than existing trenches, and preparation of the recesses is easier than preparation of the existing trenches; moreover, when depositing the first dielectric layer, the P-type doped regions, and N-type doped regions inside the recesses, the deposition effect thereof is better.

2. Since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding P-type doped regions or N-type doped regions, so that current leakage can be reduced and selective transport of the carriers in longitudinal and transverse directions can also be implemented, thereby facilitating multi-dimensional collection of the carriers on the bottom walls and sidewalls of the recesses.

3. Since the second dielectric layer disposed has at least one layer, multi-layer passivation is performed on the back surface of the silicon substrate through the second dielectric layer having at least one layer, to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. When the hard mask is used to selectively deposit the P-type doped regions or N-type doped regions, for example, when the hard mask is used to deposit the P-type doped regions in the recess regions, the hard mask can be used to cover the other adjacent recess region. Moreover, since a recess has a specific depth, the hard mask will not be in direct contact with the bottom of the recess, so that the deposition effect is better. In addition, since the recesses are separated by the silicon substrate protrusion structure having a specific width, when the hard mask is used for covering one type of recess to perform deposition at another recess region, accurate alignment of the hard mask is not required and a moderate amount of deviation is allowed, so that the alignment of the hard mask gets simpler and then the technological difficulty is reduced.

6. In the prior art, due to width and depth limitations to a trench region, a chemical solution cannot completely infiltrate the bottom of the trench for chemical wet texturing due to hydrophobicity of water and a silicon slice. However, in this embodiment, since the recesses are disposed and the back surface of the silicon substrate between adjacent recesses is the protrusion, it would be easier to obtain the rough texture structure by texturing than existing trench structures; moreover, reflection of light on the inner back surface of the silicon substrate is enhanced after the protrusions on the back surface of the silicon substrate are textured, thereby increasing the light absorption rate of the silicon substrate.

7. Since the first doped layers are disposed on part or all of the regions between the recesses in the silicon substrate, it would be easier for the carriers in the first doped layer to selectively pass through the first dielectric layer on the sidewall of the adjacent recess to be separated and collected into the corresponding P-type doped regions or the N-type doped regions.

Embodiment 2

The second embodiment of the disclosure provides a selective contact region buried solar cell. To facilitate explanation, merely the parts related to the embodiment of the disclosure are illustrated. With reference to FIG. 1 to FIG. 11, the selective contact region buried solar cell provided by the embodiment of the disclosure comprises:

a silicon substrate 10;

the back contact structure disposed on a back surface of the silicon substrate 10 as stated in the foregoing embodiment; and a third dielectric layer 90 disposed on a front surface of the silicon substrate 10.

Furthermore, in one embodiment of the disclosure, the second dielectric layer 50 and the third dielectric layer 90 may be respectively prepared on the front and back surface of the silicon substrate 10 through the same process. In this case, the third dielectric layer 90 may have the same structure as the second dielectric layer 50 in the foregoing embodiment. Therefore, with reference to the foregoing embodiment, preferably, the third dielectric layer 90 may also be selected from one of an aluminum oxide layer, a silicon nitride layer, a silicon oxynitride layer, an intrinsic silicon carbide layer, an intrinsic amorphous silicon layer and a silicon oxide layer, or a combination thereof.

As some examples of the disclosure, the third dielectric layer 90 may further have a three-layer structure comprising the silicon oxide layer/aluminum oxide layer and the doped polycrystalline silicon layer/doped polycrystalline silicon carbide layer/doped polycrystalline silicon oxide layer and the silicon nitride layer/silicon oxynitride layer, or a three-layer structure comprising the intrinsic amorphous silicon layer and the doped amorphous silicon layer/doped amorphous silicon oxide layer and the silicon nitride layer/silicon oxynitride layer, or a three-layer structure comprising the silicon oxide layer/aluminum oxide layer and the silicon carbide layer/doped amorphous silicon oxide layer and the silicon nitride layer/silicon oxynitride layer.

Furthermore, in one preferable embodiment of the disclosure, with reference to FIG. 1, preferably, the third dielectric layer 90 also correspondingly has a two-layer structure comprising the silicon oxide layer and the silicon carbide layer, or a two-layer structure comprising the aluminum oxide layer and the silicon carbide layer, and the thickness of the third dielectric layer 90 is greater than 50 nm. The thickness of the aluminum oxide layer or the silicon oxide layer in the third dielectric layer 90 is less than 40 nm, and the thickness of the silicon carbide layer in the third dielectric layer 90 is greater than 10 nm. In this case, the silicon carbide layer not only provides a hydrogen passivation effect, but also reduces parasitic light absorption due to a large optical band gap and a small absorption coefficient with respect to the intrinsic amorphous silicon layer and the doped polycrystalline silicon layer or the like. Furthermore, the silicon carbide layer in the third dielectric layer 90 comprises at least one silicon carbide film. The refractive indexes of the silicon carbide films successively decrease outward from the front surface of the silicon substrate 10. Furthermore, in one embodiment of the disclosure, a magnesium fluoride layer is disposed at an outer layer of the third dielectric layer 90. The refractive index requirement for the magnesium fluoride layer at the outermost layer is the lowest, and generally, the refractive index is set as 1.4, for enhancing the optical function of anti-reflection.

Certainly, the third dielectric layer 90 may have a different structural arrangement from the second dielectric layer 50 in the foregoing embodiment, and the film structures of the second dielectric layer 50 and the third dielectric layer 90 are correspondingly set depending on actual usage needs, which is not specifically limited herein.

Furthermore, in one embodiment of the disclosure, an electric field layer or a floating junction is disposed between the front surface of the silicon substrate 10 and the third dielectric layer 90, specifically comprising performing phosphorus diffusion on the silicon substrate 10 to obtain the electric field layer or performing boron diffusion to obtain the floating junction. In this case, the electric field layer or the floating junction serves as a Front-Surface Field (FSF) of the selective contact region buried solar cell.

In this embodiment, recesses are disposed at intervals on a back of a silicon substrate, and P-type doped regions and N-type doped regions are disposed alternately inside the recesses, so that separation between the P-type doped regions and the N-type doped regions inside the recesses is implemented through a protrusion structure between the recesses of the silicon substrate itself; moreover, the recesses disposed have a lower width control requirement than existing trenches, and preparation of the recesses is easier than preparation of the existing trenches. Further, when a first dielectric layer, P-type doped regions and N-type doped regions are deposited in the recesses, the deposition effect is better. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding P-type doped regions and N-type doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed has at least one layer, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high trench width control requirement and a poor passivation effect.

Embodiment 3

Figure 12:
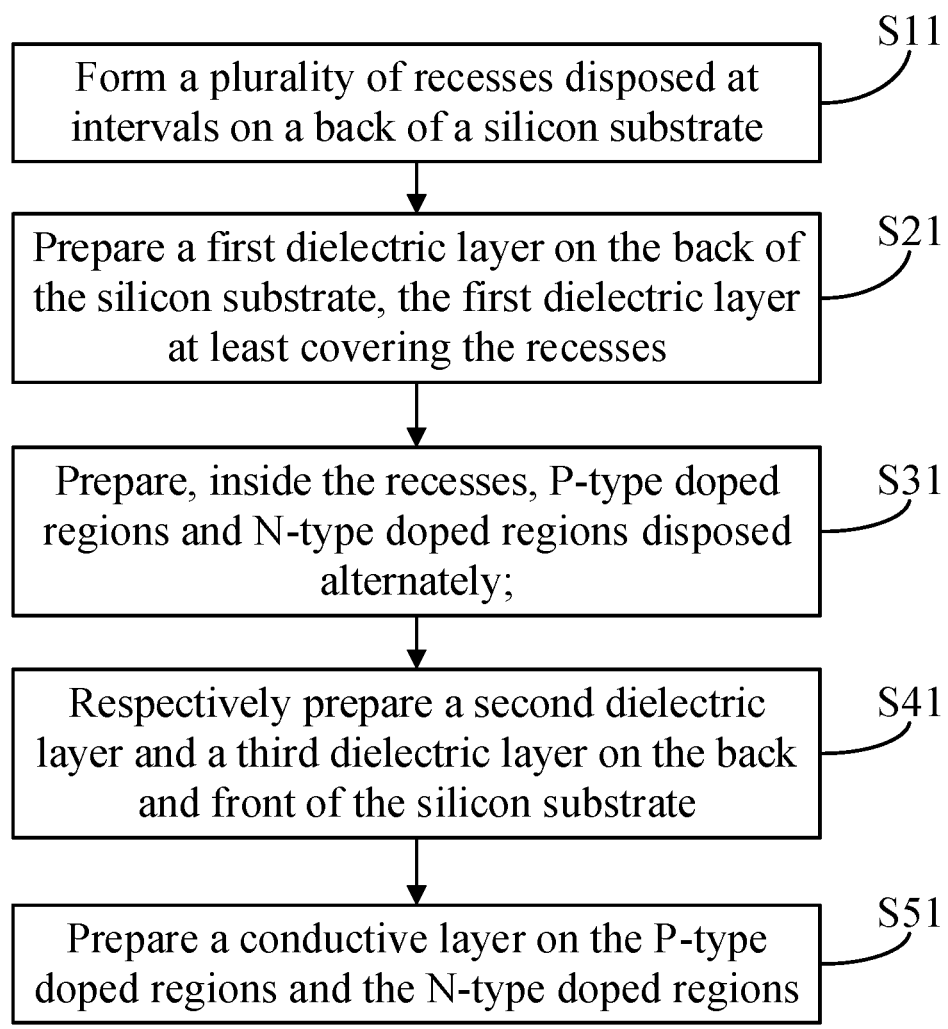
FIG. 12 is a flow chart of a selective contact region buried solar cell manufacturing method provided by another embodiment of the disclosure.

The third embodiment of the disclosure provides a selective contact region buried solar cell manufacturing method. To facilitate explanation, merely the parts related to the embodiment of the disclosure are illustrated. With reference to FIG. 12, the selective contact region buried solar cell manufacturing method provided by the embodiment of the disclosure is used for preparing the selective contact region buried solar cell as stated in the preceding embodiment, and specifically, the method comprises the following steps.

At step S11, a plurality of recesses is formed at intervals on a back of a silicon substrate.

Before step S11, it should further comprise pre-treating the silicon substrate.

The pre-treatment above comprises cleaning the silicon substrate and removing a damaged layer. Specifically, the pre-treatment comprises:

(1) performing RCA standard cleaning to remove particles, organic matters, or the like on the surface of the silicon substrate;

(2) placing the cleaned silicon substrate in a 2-5% potassium hydroxide (KOH) solution or tetramethylammonium hydroxide (TMAH) solution (i.e., a developing solution) for treatment at a temperature of 50-80° C. for 1-5 min, to remove a surface damaged layer caused in a slicing process;

(3) performing pickling on the surface of the silicon substrate using HCl, to neutralize the alkaline solution left on the surface of the silicon substrate and remove metal impurities left on the surface of the silicon slice; and (4) cleaning the silicon substrate using an HF solution, to remove a silicon oxide layer on the surface of the silicon slice and form a Si—H passivation bond with a dangling bond on the surface of the silicon substrate, and finally, performing drying using nitrogen for use.

Furthermore, after the silicon substrate is pre-treated, the recesses may be formed in the following ways:

way I: the part where the recesses need to be disposed at intervals is directly slotted through laser and partial silicon crystal is removed from the back surface of the silicon substrate, to form the desired recesses; way II: the silicon substrate is subjected to thermal oxidation treatment so that a silicon oxide layer is formed on the entire surface of the silicon substrate, silicon oxide in part of the regions on the front and back surface of the silicon substrate is removed through laser slotting, and then silicon oxide is removed using an acid (such as HF) through wet etching, to form the desired recesses; way III: a silicon nitride layer is deposited on the back surface of the silicon substrate through PECVD, silicon nitride in part of the region on the back is removed through laser slotting, and then silicon nitride is removed through wet etching, to form the desired recesses; way IV, silicon nitride is deposited on the back surface of the silicon substrate or the silicon substrate is subjected to thermal oxidation treatment to form silicon oxide, a photoresist mask is then deposited on the back, developing is enabled on a developing region through exposure using a patterned screen, the developing region is removed with a wet method using a developing agent, silicon nitride/silicon oxide in the developing region is removed using an acid (such as HF), and the photoresist mask and silicon nitride/silicon oxide are removed through wet etching, to form the desired recesses; and way V: a patterned paste is printed on the back surface of the silicon substrate as a mask, and the paste is then removed through wet etching, to form the desired recesses.

In the embodiment of the disclosure, way II is preferably used for forming the recesses, where in way II, the thermal oxidation treatment step specifically comprises: performing dry-oxygen oxidation/steam oxidation/wet-oxygen oxidation (i.e., dry-oxygen+steam) in a quartz tube, where specific reactants comprise oxygen and/or high-purity steam, the reaction pressure is 50-1000 mbar, the reaction temperature is 900-1200° C., and the thickness of silicon oxide prepared from the reaction is greater than 10 nm. The step of removing silicon oxide through laser slotting specifically comprises: removing silicon oxide to be removed through slotting by laser having a laser wavelength of 532 nm, a laser power of 10-60 W, a laser frequency less than or equal to 250-1500 KHz, and a laser pulse width of 3-50 ns. An alkaline solution and isopropyl acetone are used in the wet etching step, where the alkaline solution is KOH or TMAH, the concentration of the alkaline solution is 1-5%, the content of isopropyl acetone is 1-10%, the reaction temperature is 60-85° C., and the reaction time is 10-30 min. An acidic solution in the step of removing silicon oxide using the acid is HF, where the concentration of the acidic solution is 1-5%, the reaction temperature is room temperature, and the reaction time is 3-10 min.

Specifically, after the recess is formed through way II, the depth of the formed recess is 0.01-10 μm, the between every two adjacent recesses is 20-500 μm, in the recesses disposed at intervals, the recess width for preparing the subsequent P-type doped regions is opened as 300-600 μm, and the recess width for preparing the subsequent N-type doped regions is opened as 100-500 μm. The formed recess may be an arc, a trapezoid, or a square. Since trenches used in the prior art are prepared by laser perforation or wet etching, the width control requirement for the trenches is high and it is difficult to prepare. However, preparation of the recesses in this embodiment is easier than preparation of existing trenches, and does not have a strict width control requirement as the existing trenches.

Step S21, a first dielectric layer is prepared on the back surface of the silicon substrate, the first dielectric layer at least covering the recesses.

Before step S21, the specific production process may further comprise texturing the front surface of the silicon substrate. In this embodiment, texturing on the front is mainly achieved by corrosion using an alkaline solution, where the alkaline solution reacts with the silicon substrate to generate a water-soluble compound, and a pyramid-shaped textured structure is formed on the surface. In this case, due to the existence of the textured structure, after incident light is reflected by the textured surface for the first time, reflected light does not directly enter the air, but enters the air after encountering the adjacent textured surface and being reflected by the textured surface for the second time or even for the third time. Therefore, the incident light is used for multiple times, thereby reducing the reflectivity of the front. When the back surface of the silicon substrate also needs to have a rough texture structure, the front and back surface of the silicon substrate can be textured at the same time; and when the back surface of the silicon substrate does not need to have a rough texture structure, a silicon nitride protection layer is deposited on the back surface of the silicon substrate, the front is then textured, and the silicon nitride protection layer is removed from the back through laser, thereby avoiding texturing on the back surface of the silicon substrate.

Specifically, the first dielectric layer is prepared on the back surface of the silicon substrate according to a high-temperature oxidation process, a deposition process or the like, which is set depending on the type of the first dielectric layer to be specifically deposited and is not specifically limited therein. In this case, the first dielectric layer is one of a tunneling oxide layer, an intrinsic silicon carbide layer and an intrinsic amorphous silicon layer, or a combination thereof, and the thickness of the first dielectric layer is 1-20 nm. In this case, the first dielectric layer coves the entire back surface of the silicon substrate. However, when there is no need to dispose the first dielectric layer on the protrusions of the silicon substrate, the first dielectric layer covering the protrusions of the silicon substrate can be removed through laser.

Step S31: P-type doped regions and N-type doped regions disposed alternately are prepared inside the recesses.

The preparing, inside the recesses, P-type doped regions and N-type doped regions disposed alternately comprises two deposition modes for preparation, i.e., in-situ deposition and ex-situ deposition.

Specifically, in one embodiment of the disclosure, when adopting in-situ deposition, step S31 comprises:

alternately depositing doped amorphous silicon or doped amorphous silicon carbide in different doping types inside the recesses; and performing high temperature crystallization treatment, so that the doped amorphous silicon or doped amorphous silicon carbide is changed into doped polycrystalline silicon or doped silicon carbide to obtain the P-type doped regions and the N-type doped regions disposed alternately.

In a feasible solution, specifically, when a recess therein is subjected to in-situ deposition of the P-type doped regions, for example, the adjacent recesses where deposition is not required are covered with a mask method. In this case, in-situ deposition with P-type amorphous silicon/P-type amorphous silicon carbide is performed in the recess. It should be correspondingly indicated that the recess has a specific depth, the mask is positioned against the protrusion and thus will not directly contact the bottom of the recess, so that impurity contamination at the bottom of the recess can be reduced. Moreover, after deposition in the recesses is completed, then the recesses are shielded through the mask to perform in-situ deposition with N-type amorphous silicon/N-type amorphous silicon carbide on the adjacent recesses; and after the P-type amorphous silicon/P-type amorphous silicon carbide and the N-type amorphous silicon/N-type amorphous silicon carbide are alternately deposited inside the recesses, the temperature is increased to 700-1000° C. directly using a high-temperature or laser heating method. Therefore, after high-temperature crystallization treatment, the P-type amorphous silicon/P-type amorphous silicon carbide and the N-type amorphous silicon/N-type amorphous silicon carbide inside the recesses are changed into P-type polycrystalline silicon/P-type silicon carbide and N-type polycrystalline silicon/N-type silicon carbide, to obtain the P-type doped regions and the N-type doped regions. The mask may be a hard mask, a silicon nitride mask, a silicon oxide mask, a photoresist mask, etc.

In another feasible solution, specifically, in-situ deposition of the P-type doped regions, for example, is performed on the entire back surface of the silicon substrate. In this case, P-type amorphous silicon/P-type amorphous silicon carbide is deposited on the entire back surface of the silicon substrate; the P-type amorphous silicon/P-type amorphous silicon carbide on the other regions other than the adjacent recesses that require deposition in the silicon substrate is removed through laser ablation; N-type amorphous silicon/N-type amorphous silicon carbide is deposited on the entire back surface of the silicon substrate; then the N-type amorphous silicon/N-type amorphous silicon carbide on the other regions other than the adjacent recesses that require deposition in the silicon substrate is removed through laser ablation; and then the temperature is increased to 700-1000° C. directly using a high-temperature or laser heating method. Therefore, the P-type amorphous silicon/P-type amorphous silicon carbide and the N-type amorphous silicon/N-type amorphous silicon carbide inside the recesses are changed into P-type polycrystalline silicon/P-type silicon carbide and N-type polycrystalline silicon/N-type silicon carbide, to obtain the P-type doped regions and the N-type doped regions.

Specifically, in one embodiment of the disclosure, when adopting ex-situ deposition, step S31 comprises:

depositing intrinsic amorphous silicon or intrinsic silicon carbide inside the recesses; and alternately performing different doping types of doping inside the recesses; and performing high temperature crystallization treatment, so that the intrinsic amorphous silicon or intrinsic silicon carbide is changed into doped polycrystalline silicon or doped silicon carbide to obtain the P-type doped regions and the N-type doped regions disposed alternately.

The step of alternately performing different doping types of doping inside the recesses specifically comprises:

alternately injecting P-type ions or N-type ions for doping inside the recesses; or alternately depositing P-type doping sources and N-type doping sources inside the recesses; or alternately introducing P-type source gas or N-type source gas for doping inside the recesses.

In a feasible solution, specifically, intrinsic amorphous silicon or intrinsic silicon carbide is deposited inside the recesses; different types of ions are partially injected inside the recesses, for example, P-type ions containing elements such as boron, aluminum, gallium or the like are injected inside the recesses requiring plurality of P-type doped regions preparation, while N-type ions containing elements such as nitrogen, phosphorus, arsenic or the like are injected inside the adjacent recesses; and then high-temperature crystallization treatment is performed so that the original intrinsic amorphous silicon or original intrinsic silicon carbide is changed into doped polycrystalline silicon or doped silicon carbide. Since in deposition with intrinsic amorphous silicon/intrinsic silicon carbide, deposition may be performed on the sides and front surface of the silicon substrate, after high-temperature crystallization, it is required to add wet etching treatment to achieve bypass plating.

In a feasible solution, specifically, intrinsic amorphous silicon or intrinsic silicon carbide is first deposited inside the recesses; different doping types of doping sources are deposited inside the different recesses with a mask method for doping, for example, when P-type doping sources containing boron, aluminum, gallium or the like (such as borosilicate glass) are deposited inside the recesses requiring plurality of P-type doped regions preparation for doping to form P-type amorphous silicon/P-type silicon carbide, and N-type doping sources containing nitrogen, phosphorus, arsenic or the like (such as phosphosilicate glass) are deposited inside the recesses where plurality of N-type doped regions preparation is required for doping to form N-type amorphous silicon/N-type silicon carbide; and after the P-type doping sources and the N-type doping sources are alternately deposited inside the recesses, high-temperature crystallization treatment is performed so that the original intrinsic amorphous silicon or intrinsic silicon carbide is changed into doped polycrystalline silicon or doped silicon carbide. It should be indicated that after the different doping sources are deposited for doping and after high-temperature crystallization treatment is completed, it is also required to remove the doping sources through laser or the like.

The mask comprises a hard mask, a silicon nitride mask, a silicon oxide mask, a photoresist mask, etc. When the masks is specifically a hard mask, for example, the adjacent recesses where no deposition of the P-type doping source is required is first covered through the hard mask, and after the P-type doping source is deposited in the recess wherein deposition of the P-type doping source is required, then further through the hard mask, the recesses thereof are covered, so that the N-type doping source is deposited in the adjacent recesses, to implement depositing different doping sources inside different recesses for doping. Moreover, when the mask is specifically the silicon nitride mask, for example, silicon nitride is first deposited on the back; the recesses where deposition is required are then perforated through laser perforation to remove silicon nitride in the recesses; then after a P-type doping source is deposited in the recesses where deposition is required, silicon oxide is continuously deposited on the back so that silicon nitride covers the P-type doping source for protection; the adjacent recesses are then perforated through laser perforation to remove silicon nitride and the P-type doping source inside the adjacent recesses; then an N-type doping source is deposited in the adjacent recesses, and after the N-type doping source is deposited, the N-type doping source and silicon nitride deposited in the recesses are removed through laser perforation, so that different doping sources are deposited inside different recesses for doping. The silicon oxide mask is similar to the silicon nitride mask, and thus is no longer described herein for conciseness.

In a feasible solution, specifically, intrinsic amorphous silicon or intrinsic silicon carbide is deposited inside the recesses; different source gases are introduced inside different recesses with a mask method for doping, for example, P-type source gases containing elements such as boron, aluminum, gallium or the like (such as a borane gas or a carrier gas carrying boron trichloride or boron tribromide) are introduced inside the recesses where P-type doping region preparation is required for doping to form P-type amorphous silicon/P-type silicon carbide, and then N-type source gases containing elements such as nitrogen, phosphorus, arsenic or the like (such as a phosphorane gas or a carrier gas carrying phosphorus oxychloride) are introduced inside the recesses where N-type doping region preparation is required for doping to form N-type amorphous silicon/N-type silicon carbide; and after different doping types of the P-type source gas and the N-type source gas are alternately introduced inside the recesses, high-temperature crystallization treatment is performed so that the original intrinsic amorphous silicon or intrinsic silicon carbide is changed into doped polycrystalline silicon or doped silicon carbide. The mask comprises a hard mask, a silicon nitride mask, a silicon oxide mask, a photoresist mask, etc. The specific implementation may refer to the preceding text.

Specifically, in another embodiment of the disclosure, when adopting ex-situ deposition, step S31 may further comprise:

depositing intrinsic amorphous silicon or intrinsic silicon carbide inside the recesses; and alternately performing different types of diffusions inside the recesses through a mask, so that the intrinsic amorphous silicon or intrinsic silicon carbide is changed into doped polycrystalline silicon or doped silicon carbide to obtain the P-type doped regions and the N-type doped regions disposed alternately.

In a feasible solution, specifically, intrinsic amorphous silicon or intrinsic silicon carbide is deposited inside the recesses; and then boron diffusion is directly performed inside the recesses where P-type doping regions are required with a mask method to form the P-type doped regions, and phosphorus diffusion is performed inside the recesses where N-type doping regions are required to form the N-type doped regions. The mask comprises a hard mask, a silicon nitride mask, a silicon oxide mask, a photoresist mask, etc. The specific implementation may refer to the preceding text.

It should be indicated that in the process of alternately preparing the P-type doped regions and the N-type doped regions, since the high-temperature crystallization process is needed, the thin first dielectric layer may be partially broken. In this case, in the high-temperature diffusion process, attachment may occur at the broken part of the first dielectric layer and the back surface of the silicon substrate, and then a plurality of inner diffusion regions corresponding to the P-type doped regions or the N-type doped regions are formed on the surface of the silicon substrate in contact with the first dielectric layer.

Specifically, the P-type doped regions and the N-type doped regions are alternately prepared inside the recesses, where the plurality of P-type doped regions and the plurality of N-type doped regions comprise doped polycrystalline silicon or doped silicon carbide or doped amorphous silicon; and the total thickness of the first dielectric layer and the plurality of P-type doped regions is greater than 20 nm and the total thickness of the first dielectric layer and the plurality of N-type doped regions is greater than 20 nm.

At step S41, a second dielectric layer and a third dielectric layer are respectively prepared on the back and front surface of the silicon substrate.

Before step S41, the method may further comprise: alternately performing different types of diffusion on the positions on the back protrusions of the silicon substrate, to obtain different types of the first doped layers by diffusion on the positions of the protrusions on the back surface of the silicon substrate. When the first doped layer is the P-type diffusion layer, the specific preparation process comprises: way I: introducing a source gas containing elements such as boron, aluminum, gallium or the like (such as a borane gas or a carrier gas carrying boron trichloride or boron tribromide) for thermal diffusion to form the P-type diffusion layer; way II: depositing a doping source containing boron, aluminum, gallium or the like (such as borosilicate glass) for thermal diffusion to form the P-type diffusion layer; way III: preparing an aluminum electrode above the diffusion layer and forming the P-type diffusion layer doped with aluminum in a high-temperature process; way IV: spin-coating a doping source containing boron, aluminum, gallium or the like (such as boron tribromide) for thermal diffusion to form the P-type diffusion layer; and way V: injecting ions containing elements such as boron, aluminum, gallium or the like and performing high-temperature diffusion to form the P-type diffusion layer.

When the first doped layer is the N-type diffusion layer, the specific preparation process comprises: way I: introducing a source gas containing elements such as nitrogen, phosphorus, arsenic or the like (such as a phosphorane gas or a carrier gas carrying phosphorus oxychloride) for thermal diffusion to form the N-type diffusion layer; way II: depositing a doping source containing nitrogen, phosphorus, arsenic or the like (such as phosphosilicate glass) for thermal diffusion to form the N-type diffusion layer; way III: spin-coating a doping source containing nitrogen, phosphorus, arsenic or the like (such as phosphorus oxychloride) for thermal diffusion to form the N-type diffusion layer; and way IV: injecting ions containing elements such as nitrogen, phosphorus, arsenic or the like and performing high-temperature diffusion to form the N-type diffusion layer. It should be indicated that after a doping source is deposited for thermal diffusion, it is also required to remove the doping source through laser or the like.

Furthermore, before step S41, the method may further comprise: texturing the positions of the protrusions between the recesses on the back surface of the silicon substrate to obtain the rough texture structure. The specific texturing process may refer to the preceding text.

Specifically, in the process of respectively preparing the second dielectric layer and the third dielectric layer on the back and front surface of the silicon substrate, the preparation is implemented depending on the specific composition types of the second dielectric layer and the third dielectric layer, which is not specifically limited therein. Correspondingly, the second dielectric layer and the third dielectric layer may be one of an aluminum oxide layer, a silicon nitride layer, a silicon oxynitride layer, an intrinsic silicon carbide layer, an intrinsic amorphous silicon layer and a silicon oxide layer, or a combination thereof. In addition, when the second dielectric layer and the third dielectric layer each are set to have a multi-layer structure, the refractive indexes of different silicon carbide films decrease from the front surface of the silicon substrate to outside, and a magnesium fluoride layer having the lowest requirement for the refractive index may be prepared at the outermost layer.

In addition, before the third dielectric layer is prepared on the front surface of the silicon substrate, an electric field layer or a floating junction may be prepared first, specifically comprising performing phosphorus diffusion on the silicon substrate to obtain the electric field layer or performing boron diffusion to obtain the floating junction. In this case, the electric field layer or the floating junction serves as the FSF of the selective contact region buried solar cell.

At step S51, a conductive layer is prepared on the P-type doped regions and the N-type doped regions.

Specifically, when the second dielectric layer only covers protrusion regions between the recesses in the silicon substrate, the conductive layer covers the entire back of the P-type doped regions and the N-type doped regions for electrical connection; when the second dielectric layer extends to cover the P-type doped regions and the N-type doped regions, the conductive layer covers the back of the remaining part that does not cover the second dielectric layer in the P-type doped regions and the N-type doped regions; and when the second dielectric layer covers the entire back surface of the silicon substrate, the conductive layer passes through the second dielectric layer as well as the P-type doped regions and the N-type doped regions through perforation or the like for electrical connection, so that first electrodes are formed on the P-type doped regions and second electrodes are formed on the N-type doped regions.

When the back contact structure applied to HBC cells (IBC heterojunction solar cells) manufactured in low-temperature processes is prepared, the conductive layer is the TCO (transparent conductive oxide) film and the metal electrode, and when the back contact structure applied to POLO-IBC cells (passivated contact IBC cells) manufactured in high-temperature processes is prepared, the conductive layer is the metal electrode. Meanwhile, the metal electrode comprises a silver electrode, a copper electrode, an aluminum electrode, a tin-clad copper electrode, or a silver-clad copper electrode. Furthermore, the copper electrode is electro-plated copper prepared through an electroplating process or a copper electrode prepared through physical vapor deposition. The electro-plated copper uses nickel, chromium, titanium, and tungsten electrodes as a seed layer or a protection layer thereof.

The embodiment of the disclosure has the following beneficial effects with respect to the prior art:

1. The recesses are disposed at intervals on the back surface of the silicon substrate; moreover, P-type doped regions and N-type doped regions are disposed alternately inside the recesses, so that separation between the P-type doped regions and the N-type doped regions inside the recesses is implemented through a protrusion structure between the recesses of the silicon substrate itself; moreover, the recesses disposed have a lower width control requirement than existing trenches, and preparation of the recesses is easier than preparation of the existing trenches; moreover, when depositing the first dielectric layer, the P-type doped regions, and the N-type doped regions inside the recesses, the deposition effect thereof is better.

2. Since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding P-type doped regions or N-type doped regions, so that current leakage can be reduced and selective transport of the carriers in longitudinal and transverse directions can also be implemented, thereby facilitating multi-dimensional collection of the carriers on the bottom walls and sidewalls of the recesses.

3. Since the second dielectric layer disposed has at least one layer, multi-layer passivation is performed on the back surface of the silicon substrate through the second dielectric layer having at least one layer, to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. When the hard mask is used to selectively deposit the P-type doped regions or N-type doped regions, for example, when the hard mask is used to deposit the P-type doped regions in the recess regions, the hard mask can be used to cover the other adjacent recess region. Moreover, since a recess has a specific depth, the hard mask will not be in direct contact with the bottom of the recess, so that the deposition effect is better. In addition, since the recesses are separated by the silicon substrate protrusion structure having a specific width, when the hard mask is used for covering one type of recess to perform deposition at another recess region, accurate alignment of the hard mask is not required and a moderate amount of deviation is allowed, so that the alignment of the hard mask gets simpler and then the technological difficulty is reduced.

6. In the prior art, due to width and depth limitations to a trench region, a chemical solution cannot completely infiltrate the bottom of the trench for chemical wet texturing due to hydrophobicity of water and a silicon slice. However, in this embodiment, since the recesses are disposed and the back surface of the silicon substrate between adjacent recesses is the protrusion, it would be easier to obtain the rough texture structure by texturing than existing trench structures; moreover, reflection of light on the inner back surface of the silicon substrate is enhanced after the protrusions on the back surface of the silicon substrate are textured, thereby increasing the light absorption rate of the silicon substrate.

7. Since the first doped layers are disposed on part or all of the regions between the recesses in the silicon substrate, it would be easier for the carriers in the first doped layer to selectively pass through the first dielectric layer on the sidewall of the adjacent recess to be separated and collected into the corresponding P-type doped regions or the N-type doped regions.

Embodiment 4

The fourth embodiment of the disclosure further provides a cell assembly comprising the selective contact region buried solar cell according to the preceding embodiment.

In the cell assembly in this embodiment, through the set selective contact region buried solar cell, recesses are disposed at intervals on a back of a silicon substrate, and P-type doped regions and N-type doped regions are disposed alternately inside the recesses, so that separation between the P-type doped regions and the N-type doped regions inside the recesses is implemented through a protrusion structure between the recesses of the silicon substrate itself; moreover, the recesses disposed have a lower width control requirement than existing trenches, and preparation of the recesses is easier than preparation of the existing trenches. Further, when a first dielectric layer, P-type doped regions and N-type doped regions are deposited in the recesses, the deposition effect is better. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding P-type doped regions and N-type doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed has at least one layer, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high trench width control requirement and a poor passivation effect.

Embodiment 5

The fifth embodiment of the disclosure further provides a photovoltaic system comprising the cell assembly according to the preceding embodiments.

In the photovoltaic system of this embodiment, through the selective contact region buried solar cell provided in the cell assembly, recesses are disposed at intervals on a back of a silicon substrate, and P-type doped regions and N-type doped regions are disposed alternately inside the recesses, so that separation between the P-type doped regions and the N-type doped regions inside the recesses is implemented through a protrusion structure between the recesses of the silicon substrate itself; moreover, the recesses disposed have a lower width control requirement than existing trenches, and preparation of the recesses is easier than preparation of the existing trenches. Further, when a first dielectric layer, P-type doped regions and N-type doped regions are deposited in the recesses, the deposition effect is better. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding P-type doped regions and N-type doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed has at least one layer, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high trench width control requirement and a poor passivation effect.

It will be obvious to those skilled in the art that changes and modifications may be made, and therefore, the aim in the appended claims is to cover all such changes and modifications.

What is claimed is:

1. A back contact structure of a solar cell, the back contact structure comprising:
    a silicon substrate, the silicon substrate comprising a back surface comprising a plurality of recesses disposed at intervals;
    a first dielectric layer disposed in the plurality of recesses on the back surface of the silicon substrate, the first dielectric layer covering bottom walls of the plurality of recesses;
    a plurality of P-type doped regions and a plurality of N-type doped regions disposed on the first dielectric layer and disposed alternately in the plurality of recesses;
    a second dielectric layer disposed on the silicon substrate between the plurality of P-type doped regions and the plurality of N-type doped regions, wherein the second dielectric layer is at least one in number; and
    a conductive layer disposed on the plurality of P-type doped regions and the plurality of N-type doped regions;
    wherein
    a total thickness of the first dielectric layer and the plurality of P-type doped regions and a total thickness of the first dielectric layer and the plurality of N-type doped regions disposed in the plurality of recesses are less than a depth of the plurality of recesses, and the first dielectric layer, the plurality of P-type doped regions, and the plurality of N-type doped regions are enclosed inside the plurality of recesses; and
    the second dielectric layer covers side walls of the plurality of recesses.

2. The back contact structure of claim 1, wherein the plurality of P-type doped regions and the plurality of N-type doped regions comprise doped polycrystalline silicon, doped silicon carbide or doped amorphous silicon.

3. The back contact structure of claim 1, wherein the first dielectric layer comprises a tunneling oxide layer, an intrinsic silicon carbide layer, an intrinsic amorphous silicon layer, or a combination thereof.

4. The back contact structure of claim 1, wherein the second dielectric layer comprises an aluminum oxide layer, a silicon nitride layer, a silicon oxynitride layer, an intrinsic silicon carbide layer, an intrinsic amorphous silicon layer, a silicon oxide layer, or a combination thereof.

5. The back contact structure of claim 1, wherein the second dielectric layer covers regions between the plurality of recesses of the silicon substrate, or extends to cover the plurality of P-type doped regions and/or the plurality of N-type doped regions.

6. The back contact structure of claim 1, wherein a width of the plurality of recesses receiving the plurality of P-type doped regions is set to 300-600 µm, a width of the plurality of recesses receiving the plurality of N-type doped regions is set to 100-500 µm, a depth of each of the plurality of recesses is 0.01-10 µm, and a distance between every two adjacent recesses is 20-500 µm.

7. The back contact structure of claim 1, wherein the plurality of recesses is in the shape of an arc, a trapezoid, or a square.

8. The back contact structure of claim 1, wherein a thickness of the first dielectric layer is 1-20 nm, a total thickness of the first dielectric layer and the plurality of P-type doped regions is greater than 20 nm, and a total thickness of the first dielectric layer and the plurality of N-type doped regions is greater than 20 nm.

9. The back contact structure of claim 2, wherein the doped silicon carbide comprises doped hydrogenated silicon carbide.

10. The back contact structure of claim 3, wherein the first dielectric layer comprises the tunneling oxide layer and the intrinsic silicon carbide layer.

11. The back contact structure of claim 3, wherein the tunneling oxide layer comprises one or more of a silicon oxide layer and an aluminum oxide layer.

12. The back contact structure of claim 4, wherein the second dielectric layer comprises the aluminum oxide layer and the intrinsic silicon carbide layer, or the second dielectric layer comprises the silicon oxide layer and the intrinsic silicon carbide layer, and the thickness of the second dielectric layer is greater than 25 nm.

13. The back contact structure of claim 12, wherein a thickness of the aluminum oxide layer or the silicon oxide layer in the second dielectric layer is less than 25 nm, and a thickness of the intrinsic silicon carbide layer in the second dielectric layer is greater than 10 nm.

14. The back contact structure of claim 4, wherein a magnesium fluoride layer is disposed at an outer layer of the second dielectric layer.

15. The back contact structure of claim 1, wherein the conductive layer comprises a transparent conductive oxide (TCO) film and/or a metal electrode.

16. The back contact structure of claim 15, wherein the metal electrode comprises a silver electrode, a copper electrode, an aluminum electrode, a tin-clad copper electrode, or a silver-clad copper electrode.

17. The back contact structure of claim 1, wherein the first dielectric layer corresponding to the plurality of P-type doped regions is the same as or different from the first dielectric layer corresponding to the plurality of N-type doped regions.

18. A selective contact region buried solar cell, comprising:
the back contact structure of claim 1; and
a third dielectric layer disposed on a front surface of the silicon substrate.

19. The selective contact region buried solar cell of claim 18, wherein the third dielectric layer comprises an aluminum oxide layer, a silicon nitride layer, a silicon oxynitride layer, a silicon carbide layer, an intrinsic amorphous silicon layer, a silicon oxide layer, or a combination thereof.

20. The selective contact region buried solar cell of claim 19, wherein the third dielectric layer comprises the silicon oxide layer and the silicon carbide layer, or the third dielectric layer comprises the aluminum oxide layer and the silicon carbide layer, and a thickness of the third dielectric layer is greater than 50 nm.

21. The selective contact region buried solar cell of claim 20, wherein a thickness of the aluminum oxide layer or the silicon oxide layer in the third dielectric layer is less than 40 nm, and a thickness of the silicon carbide layer in the third dielectric layer is greater than 10 nm.

22. The selective contact region buried solar cell of claim 19, wherein the silicon carbide layer in the third dielectric layer comprises at least one silicon carbide film; and refractive indexes of different silicon carbide films decrease from the front surface of the silicon substrate to outside.

23. The selective contact region buried solar cell of claim 19, wherein a magnesium fluoride layer is disposed on an outer layer of the third dielectric layer.

24. A cell assembly, comprising the selective contact region buried solar cell of claim 18.

* * * * *